(12) United States Patent
Lee

(10) Patent No.: US 11,889,685 B2
(45) Date of Patent: Jan. 30, 2024

(54) SEMICONDUCTOR DEVICE AND MANUFACTURING METHOD THEREOF

(71) Applicant: SK hynix Inc., Icheon-si Gyeonggi-do (KR)

(72) Inventor: Nam Jae Lee, Cheongju-si Chungcheongbuk-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/391,987

(22) Filed: Aug. 2, 2021

(65) Prior Publication Data

US 2021/0366922 A1 Nov. 25, 2021

Related U.S. Application Data

(63) Continuation of application No. 16/385,956, filed on Apr. 16, 2019, now Pat. No. 11,107,824.

(30) Foreign Application Priority Data

Sep. 19, 2018 (KR) .................. 10-2018-0112508

(51) Int. Cl.
  *H10B 41/27* (2023.01)
  *G11C 5/02* (2006.01)
  *H10B 43/27* (2023.01)

(52) U.S. Cl.
  CPC ............. *H10B 41/27* (2023.02); *G11C 5/025* (2013.01); *H10B 43/27* (2023.02)

(58) Field of Classification Search
  CPC ......... H01L 27/11565; H01L 27/11573; H01L 27/11524; H01L 27/1157
  See application file for complete search history.

(56) References Cited

U.S. PATENT DOCUMENTS

| 6,248,623 | B1 | 6/2001 | Chien et al. |
| 8,278,695 | B2 | 10/2012 | Kidoh et al. |
| 2006/0029887 | A1 | 2/2006 | Oh et al. |
| 2011/0223731 | A1 | 9/2011 | Chung et al. |
| 2013/0140623 | A1 | 6/2013 | Lee et al. |
| 2015/0021792 | A1* | 1/2015 | Escher-Poeppel ...... H01L 24/27 257/784 |
| 2017/0236896 | A1 | 8/2017 | Lu et al. |
| 2017/0345843 | A1 | 11/2017 | Lee et al. |
| 2017/0352673 | A1 | 12/2017 | Lee |
| 2017/0373089 | A1 | 12/2017 | Kim et al. |

FOREIGN PATENT DOCUMENTS

| CN | 106952926 A | 7/2017 |
| CN | 107452673 A | 12/2017 |
| CN | 108063142 A | 5/2018 |

* cited by examiner

*Primary Examiner* — Julio J Maldonado
*Assistant Examiner* — Stanetta D Isaac
(74) *Attorney, Agent, or Firm* — William Park & Associates Ltd.

(57) ABSTRACT

A semiconductor device, and a method of manufacturing a semiconductor device, includes first stack structures enclosing first channel structures and spaced apart from each other. The first channel structures are spaced apart from each other at a first distance in each of the first stack structures and the first stack structures are spaced apart from each other at a second distance.

12 Claims, 24 Drawing Sheets

SEMICONDUCTOR DEVICE AND MANUFACTURING METHOD THEREOF

CROSS-REFERENCE TO RELATED APPLICATION

The present application is a continuation application of U.S. patent application Ser. No. 16/385,956, filed on Apr. 16, 2019, and claims priority under 35 U.S.C. § 119(a) to Korean patent application number 10-2018-0112508, filed on Sep. 19, 2018, in the Korean Intellectual Property Office, the entire disclosure of which is incorporated herein by reference.

BACKGROUND

1. Technical Field

Various embodiments generally relate to a semiconductor device and a method of manufacturing the semiconductor device, and more particularly, to a three-dimensional semiconductor memory device and a method of manufacturing the three-dimensional semiconductor memory device.

2. Related Art

A semiconductor device may include a memory cell array including a plurality of memory cells. The memory cell array may include memory cells disposed in various structures. The memory cells may be arranged in three dimensions on a substrate to improve integration density of the semiconductor device.

SUMMARY

According to an embodiment, a semiconductor device may include first stack structures spaced apart from each other, first channel groups of first channel structures passing through the first stack structures, a second stack structure disposed above or under the first stack structures, and second channel structures passing through the second stack structure and coupled to the first channel structures in a one-to-one manner. Each of the first channel groups is surrounded by a corresponding first stack structure of the first stack structures. The first channel structures are spaced apart from each other by a first distance within a corresponding first stack structure of the first stack structures. The first channel groups are spaced apart from each other by a second distance.

According to an embodiment, a semiconductor device may include first stack structures spaced apart from each other by a first separation region, first channel structures passing through the first stack structures, a second stack structure disposed above or under the first stack structures and including a connection region overlapping the first separation region, and second channel structures passing through the second stack structure and coupled to the first channel structures in a one-to-one manner. In a plan view, the second channel structures may be disposed closer to the connection region than the first channel structures.

According to an embodiment, a semiconductor device may include cell stack structures each including a connection region and side regions extending from both sides of the connection region, and the cell stack structures separated from each other by a slit, select stack structures disposed above or under the cell stack structures and separated from each other by a first separation region overlapping the connection region or a second separation region overlapping the slit, first channel structures passing through the select stack structures, and second channel structures passing through the cell stack structures and coupled to the first channel structures in a one-to-one manner. In a plan view, the first channel structures may be disposed closer to the second separation region than the second channel structures.

According to an embodiment, a method of manufacturing a semiconductor device may include forming a conductive layer including line regions and etching regions alternately disposed with each other, forming first channel structures passing through the conductive layer in the line regions and protruding farther than the conductive layer, forming insulating patterns filling a first distance defined between the first channel structures in each of the line regions, and removing the etching regions of the conductive layer which are exposed between the insulating patterns to divide the conductive layer into line patterns.

DETAILED DESCRIPTION

The technical spirit of the present disclosure may include examples of embodiments to which various modifications and changes may be applied and which include various forms. Hereinafter, embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Various embodiments may be directed to a semiconductor device with improved integration density, and a manufacturing method pertaining to improving the integration density of the semiconductor device.

Figure 1A:
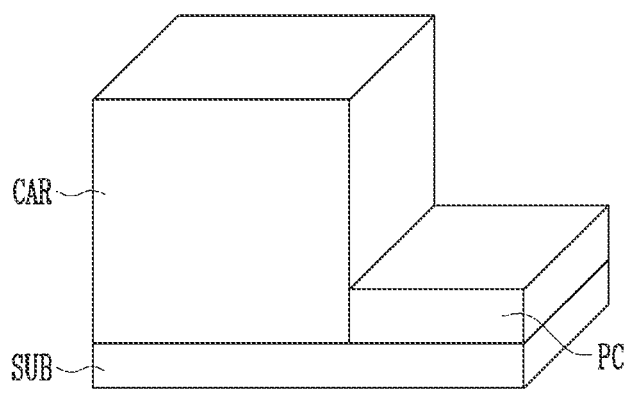
FIGS. 1A and 1B are block diagrams schematically illustrating semiconductor devices according to embodiments.
Figure 1B:
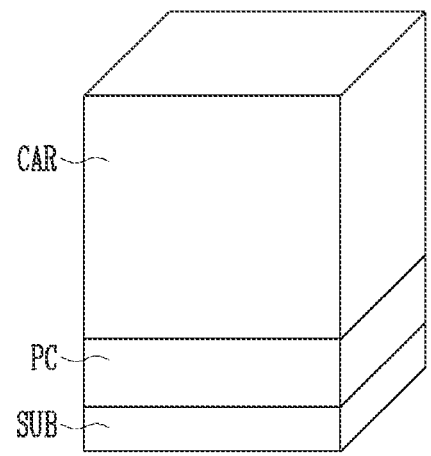

FIGS. 1A and 1B are block diagrams schematically illustrating semiconductor devices according to embodiments.

Referring to FIGS. 1A and 1B, each of semiconductor devices according to embodiments may include a peripheral circuit structure PC and a cell array CAR disposed on a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The cell array CAR may include a plurality of cell strings. The cell strings may be electrically coupled to a bit line, a source line, word lines, and select lines, respectively. Each of the cell strings may include memory cells and select transistors coupled in series. Each of the select lines may serve as a gate electrode of a corresponding select transistor, and each of the word lines may serve as a gate electrode of a corresponding memory cell.

The peripheral circuit structure PC may include NMOS transistors, PMOS transistors, a resistor, and a capacitor which are electrically coupled to the cell array CAR. The NMOS transistors, the PMOS transistors, the resistor, and the capacitor may serve as devices which constitute a row decoder, a column decoder, a page buffer and a control circuit.

As shown in FIG. 1A, the peripheral circuit structure PC may be disposed on a portion of the substrate SUB which is not overlapped with the cell array CAR.

Alternatively, as shown in FIG. 1B, the peripheral circuit structure PC may be disposed between the cell array CAR and the substrate SUB. Since the peripheral circuit structure PC overlaps the cell array CAR, an area of the substrate SUB which is occupied by the cell array CAR region and the peripheral circuit structure PC may be decreased.

Figure 2:
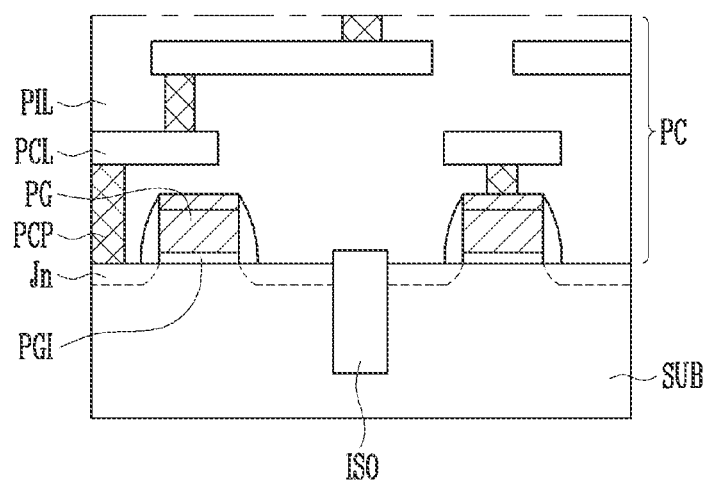
FIG. 2 is a cross-sectional diagram schematically illustrating a peripheral circuit structure.

FIG. 2 is a cross-sectional diagram schematically illustrating the peripheral circuit structure PC.

Referring to FIG. 2, the peripheral circuit structure PC may include peripheral gate electrodes PG, a peripheral gate insulating layer PGI, junctions Jn, peripheral circuit wires PCL, peripheral contact plugs PCP, and a peripheral circuit insulating layer PIL.

The peripheral gate electrodes PG may serve as gate electrodes of NMOS transistors and gate electrodes of PMOS transistors of the peripheral circuit structure PC, respectively. The peripheral gate insulating layer PGI may be disposed between each of the peripheral gate electrodes PG and the substrate SUB.

The junctions Jn may be regions defined by injecting an n-type or p-type impurity into an active region of the substrate SUB. The junctions Jn may be disposed at both sides of each of the peripheral gate electrodes PG, respectively, to serve as a source junction or a drain junction. The active region of the substrate SUB may be divided by an isolation layer ISO formed in the substrate SUB. The isolation layer ISO may include an insulating material.

The peripheral circuit wires PCL may be electrically coupled to a circuit of the peripheral circuit structure PC through the peripheral contact plugs PCP.

The peripheral circuit insulating layer PIL may cover a circuit of the peripheral circuit structure PC, the peripheral circuit wires PCL and the peripheral contact plugs PCP. The peripheral circuit insulating layer PIL may include insulating layers stacked in multiple layers.

FIGS. 3A to 3D are diagrams illustrating first stack structures ST1 and first channel structures CH1 passing through the first stack structures ST1 of a semiconductor device according to an embodiment.

Figure 3A:
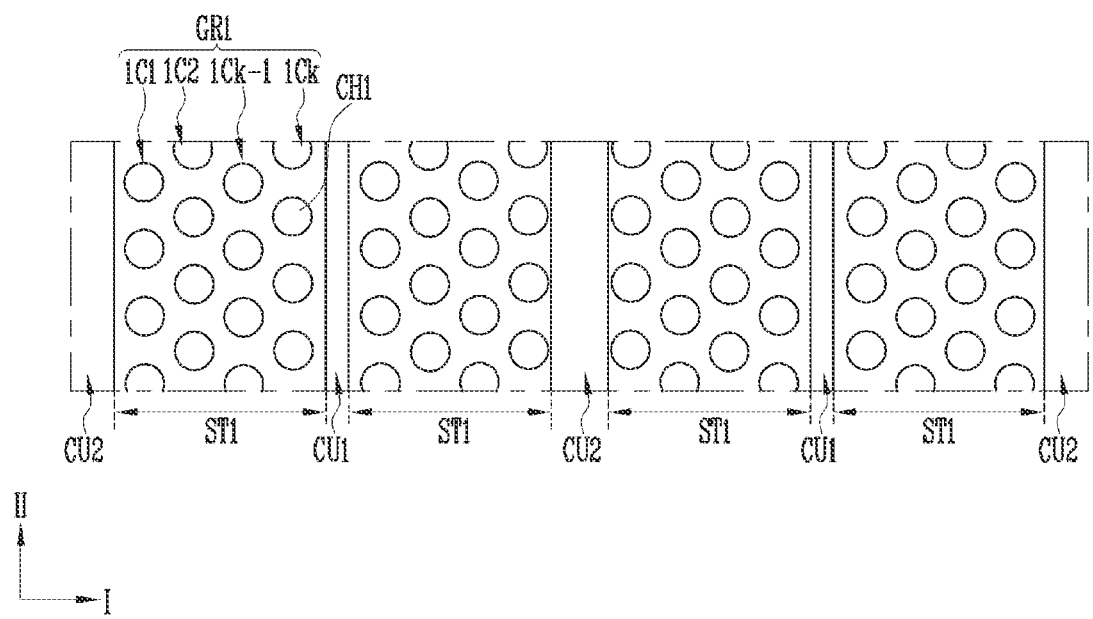
FIGS. 3A to 3D are diagrams illustrating first stack structures and first channel structures passing through the first stack structures of a semiconductor device according to an embodiment.

Referring to FIG. 3A, a semiconductor device according to an embodiment may include the first stack structures ST1 arranged in a first direction I. Each of the first stack structures ST1 may have a linear shape extending in a second direction II intersecting the first direction I. The first direction I and the second direction II may be horizontal and parallel to a top surface of the substrate SUB shown in FIGS. 1A and 1B. The first stack structures ST1 may be penetrated by the first channel structures CH1. The first stack structures ST1 may be separated from each other by separation regions CU1 and CU2.

The separation regions CU1 and CU2 may include the first separation regions CU1 and the second separation regions CU2. Each of the first separation regions CU1 and the second separation regions CU2 may be disposed between each pair of the first stack structures ST1 neighboring each other in the first direction I. At least one first separation region CU1 may be disposed between the second separation regions CU2 neighboring each other in the first direction I. The second separation regions CU2 may be disposed at boundaries of the memory blocks, respectively.

The number of first separation regions CU1 disposed between the second separation regions CU2 neighboring each other in the first direction I may vary depending on the number of first stack structures ST1 which constitute each of the memory blocks. For example, when each of memory blocks includes two first stack structures ST1 neighboring in the first direction I, a single first separation region CU1 may be disposed between the second separation regions CU2 neighboring in the first direction I. The embodiments are not limited thereto, and three or more first stack structures ST1 separated from each other by two or more first separation regions CU1 may be disposed between the second separation regions CU2 neighboring each other in the first direction I.

Each of the first separation regions CU1 may have the same width as each of the second separation regions CU2 in the first direction I. Alternatively, to miniaturize a semiconductor device, each of the first separation regions CU1 may have a smaller width than each of the second separation regions CU2.

The first channel structures CH1 may be divided into first channel groups GR1. Each of the first channel groups GR1 may include the plurality of first channel structures CH1 surrounded with the corresponding first stack structure ST1. The first channel groups GR1 may include the plurality of first channel structures CH1 which are distributed at the same density. The plurality of the first channel structures CH1 included in each of the first channel groups GR1 may constitute first to kth rows $1C_1$ to $1C_k$, where k is a natural number of 2 or more. The first to kth rows $1C_1$ to $1C_k$ may be sequentially disposed in the first direction I, and each of the first to kth rows $1C_1$ to $1C_k$ may include the first channel structures CH1 arranged in the second direction II.

The plurality of first channel structures CH1 included in each of the first channel groups GR1 may be disposed in a zigzag format to increase arrangement density of the first channel structures CH1. The embodiments may not be limited thereto, and the first channel structures CH1 of the first to kth rows $1C_1$ to $1C_k$ may be arranged parallel with each other in the first direction I and the second direction II.

The plurality of first channel structures CH1 included in each of the first channel groups GR1 may be spaced apart from each other at a first distance. The first channel groups GR1 may be spaced apart from each other at a second distance or a third distance. Each of the second distance and the third distance is greater than the first distance.

Figure 3B:
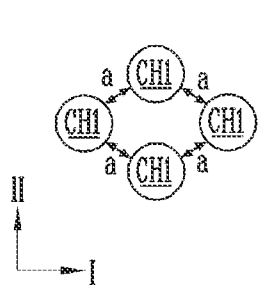

FIG. 3B is a plan view illustrating a first distance "a" between the first channel structures CH1 included in each of the first channel groups GR1 and neighboring each other as shown in FIG. 3A.

Referring to FIG. 3B, the first distance "a" may be a distance between the first channel structures CH1 included in the same group. The first distance "a" may be set to have various ranges according to a design rule of a semiconductor device.

Figure 3C:
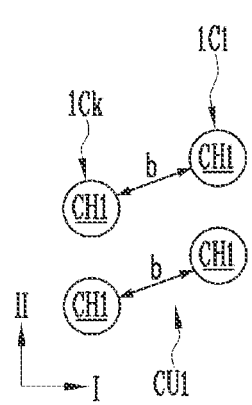

FIG. 3C is a plan view illustrating a second distance "b" between edge channel structures disposed adjacent to boundaries between the first channel groups GR1 as shown in FIG. 3A.

Referring to FIG. 3C, the second distance "b" between the edge channel structures may be a distance between the first channel structure CH1 of the first row $1C_1$ and the first channel structure CH1 of the kth row $1C_k$ which neighbor each other with the first separation region CU1 of FIG. 3A interposed therebetween. The second distance "b" may be set to have various ranges according to a design rule of a semiconductor device.

Figure 3D:
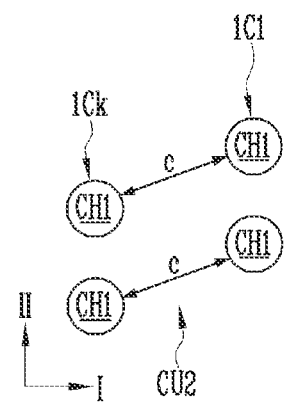

FIG. 3D is a plan view illustrating a third distance "c" between the edge channel structures disposed adjacent to the boundaries between the first channel groups GR1 as shown in FIG. 3A.

Referring to FIG. 3D, the third distance "c" between the edge channel structures may be a distance between the first channel structure CH1 of the first row $1C_1$ and the first channel structure CH1 of the kth row $1C_k$ which neighbor each other with the second separation region CU2 of FIG. 3A interposed therebetween. The third distance "c" may be set to have various ranges according to a design rule of a semiconductor device.

Referring to FIGS. 3B to 3D, each of the second distance "b" and the third distance "c" may be greater than the first distance "a." The first separation region CU1 and the second separation region CU2 may be defined by a self-aligning method by using the first, second, and third distances between the first channel structures CH1. In some embodiments, the third distance "c" may be greater than the second distance "b" and the second distance "b" may be greater than the first distance "a."

Figure 4:
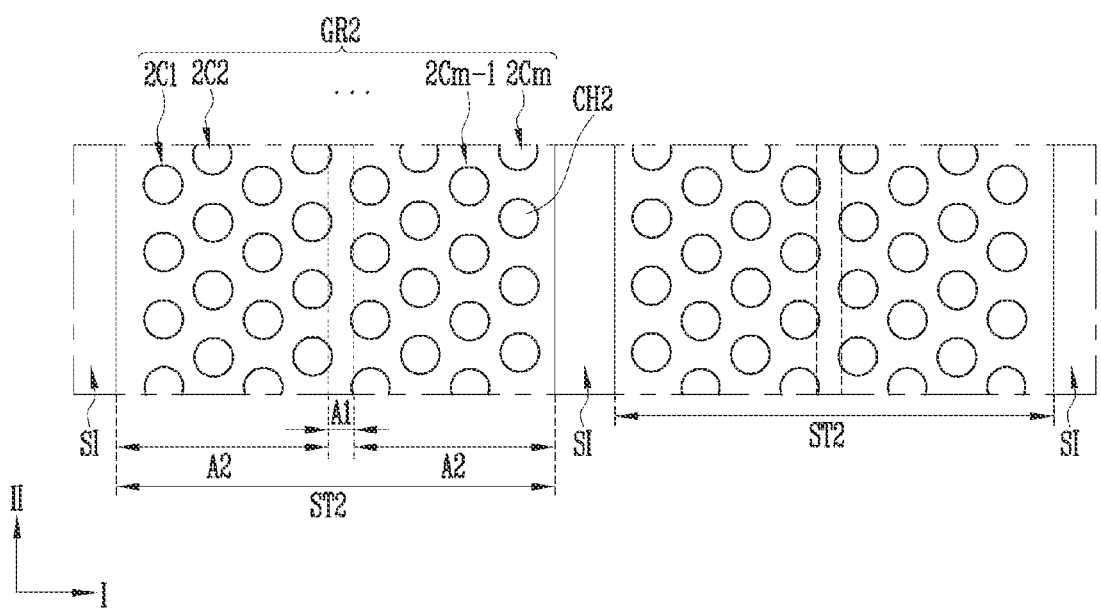
FIG. 4 is a plan view illustrating second stack structures and second channel structures passing through the second stack structures of a semiconductor device according to an embodiment.

FIG. 4 is a plan view illustrating second stack structures ST2 and second channel structures CH2 passing through the second stack structures ST2 of a semiconductor device according to an embodiment. The second stack structures ST2 shown in FIG. 4 may be disposed above or under the first stack structures ST1 shown in FIG. 3A.

Referring to FIG. 4, a semiconductor device according to an embodiment may include the second stack structures ST2 arranged in the first direction I. Each of the second stack structures ST2 may have a linear shape extending in the second direction II. The second stack structures ST2 may be penetrated by the second channel structures CH2. The second stack structures ST2 may be separated from each other by slits SI. The slits SI may overlap the second separation regions CU2 shown in FIG. 3A, respectively.

Each of the second stack structures ST2 may include at least one connection region A1 and side regions A2. The connection region A1 may overlap a corresponding first separation region among the first separation regions CU1 shown in FIG. 3A. The side regions A2 may extend from both sides of the connection region A1. Each of the side regions A2 may overlap a corresponding first stack structure among the first stack structures ST1 shown in FIG. 3A.

The second channel structures CH2 may be coupled to the first channel structures CH1 shown in FIG. 3A, respectively. In some embodiments, the second channel structures CH2 may be coupled to the first channel structures CH1 shown in FIG. 3A in a one-to-one manner. The second channel structures CH2 may be divided into second channel groups GR2. Each of the second channel groups GR2 may include the plurality of second channel structures CH2 surrounded with a corresponding second stack structure among the second stack structures ST2. The second channel groups GR2 may include the second channel structures CH2 distributed at the same density. The second channel structures CH2 included in each of the second channel groups GR2 may be coupled to the first channel structures CH1 included in the two or more first channel groups GR1 shown in FIG. 3A, respectively. The second channel structures CH2 included in each of the second channel groups GR2 may constitute first to mth rows $2C_1$ to $2C_m$, where m is a natural number of 2k or more. The first to mth rows $2C_1$ to $2C_m$ may be sequentially disposed in the first direction I, and each of the first to mth rows $2C_1$ to $2C_m$ may include the second channel structures CH2 arranged in the second direction II.

The second channel structures CH2 included in each of the second channel groups GR2 may be disposed in a zigzag format to increase arrangement density of the second channel structures CH2. The embodiments may not be limited thereto, and the second channel structures CH2 of the first to mth rows $2C_1$ to $2C_m$ may be arranged parallel with each other in the first direction I and the second direction II.

The second channel structures CH2 included in each of the second channel groups GR2 may be disposed to have a smaller distance from each other than the second distance "b" and the third distance "c" which are shown in FIGS. 3C and 3D.

Figure 5:
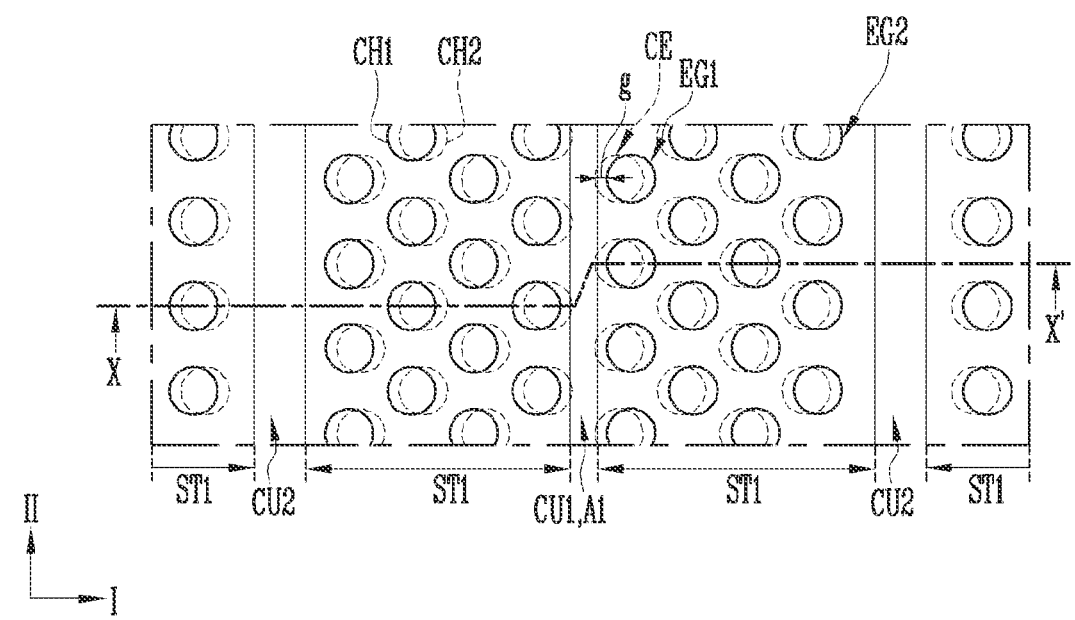
FIG. 5 is a plan view illustrating a layout of first channel structures and second channel structures according to an embodiment.

FIG. 5 is a plan view illustrating a layout of the first channel structures CH1 and the second channel structures CH2 according to an embodiment.

Referring to FIG. 5, the second channel structures CH2 may be disposed above or under the first channel structures CH1. The second channel structures CH2 may include regions which are overlapped with the first channel structures respectively, to be coupled to the first channel structures CH1, respectively. In an embodiment, the second channel structures CH2 may be coupled to the first channel structures CH1 in a one-to-one manner whereby a single first channel structure CH1 (i.e., $1C_1$) is coupled with a single overlapping second channel structure CH2 (i.e., $2C_1$). For example, referring to FIGS. 3A, 4, and 5, the first channel structure $1C_2$ overlapping with the second channel structure $2C_2$ may be couple to one another and the first channel structure $1C_k$ overlapping with the second channel structure $2C_K$ may be coupled to one another.

The first stack structures ST1 enclosing the first channel structures CH1 may be separated from each other by the first separation region CU1 or the second separation region CU2. The connection region A1 of the second stack structure ST2 shown in FIG. 4 may overlap with the first separation region CU1 above or under the first separation region CU1.

The second channel structures CH2 may be disposed closer to the connection region A1 or the first separation region CU1 than the first channel structures CH1. Accordingly, the first channel structures CH1 may be disposed closer to the second separation region CU2 than the second channel structures CH2. According to these arrangements, a space to dispose the first separation region CU1 overlapping the connection region A1 may be obtained between the first channel structures CH1.

The first channel structures CH1 may include a first edge channel structure EG1 adjacent to the first separation region CU1 and a second edge channel structure EG2 adjacent to the second separation region CU2. The second channel structures CH2 may include a center channel structure CE adjacent to the first separation region CU1.

The center channel structure CE may include a portion overlapping the first separation region CU1. In other words, the center channel structure CE may include a portion disposed in the connection region A1. Even when the center channel structure CE and the first separation region CU1 are spaced apart from each other, a distance "g" between the first edge channel structure EG1 and the first separation region CU1 may be greater than a distance between the center channel structure CE and the first separation region CU1.

The second stack structures ST2 shown in FIG. 4 may be disposed above or under the first stack structures ST1 shown in FIG. 3A such that the second channel structures CH2 overlap the first channel structures CH1, respectively, as shown in FIG. 5. This arrangement structure may be applied to the cell array CAR shown in FIGS. 1A and 1B. Hereinafter, the cell array CAR according to an embodiment will be described below with reference to FIGS. 6A and 6B.

Figure 6A:
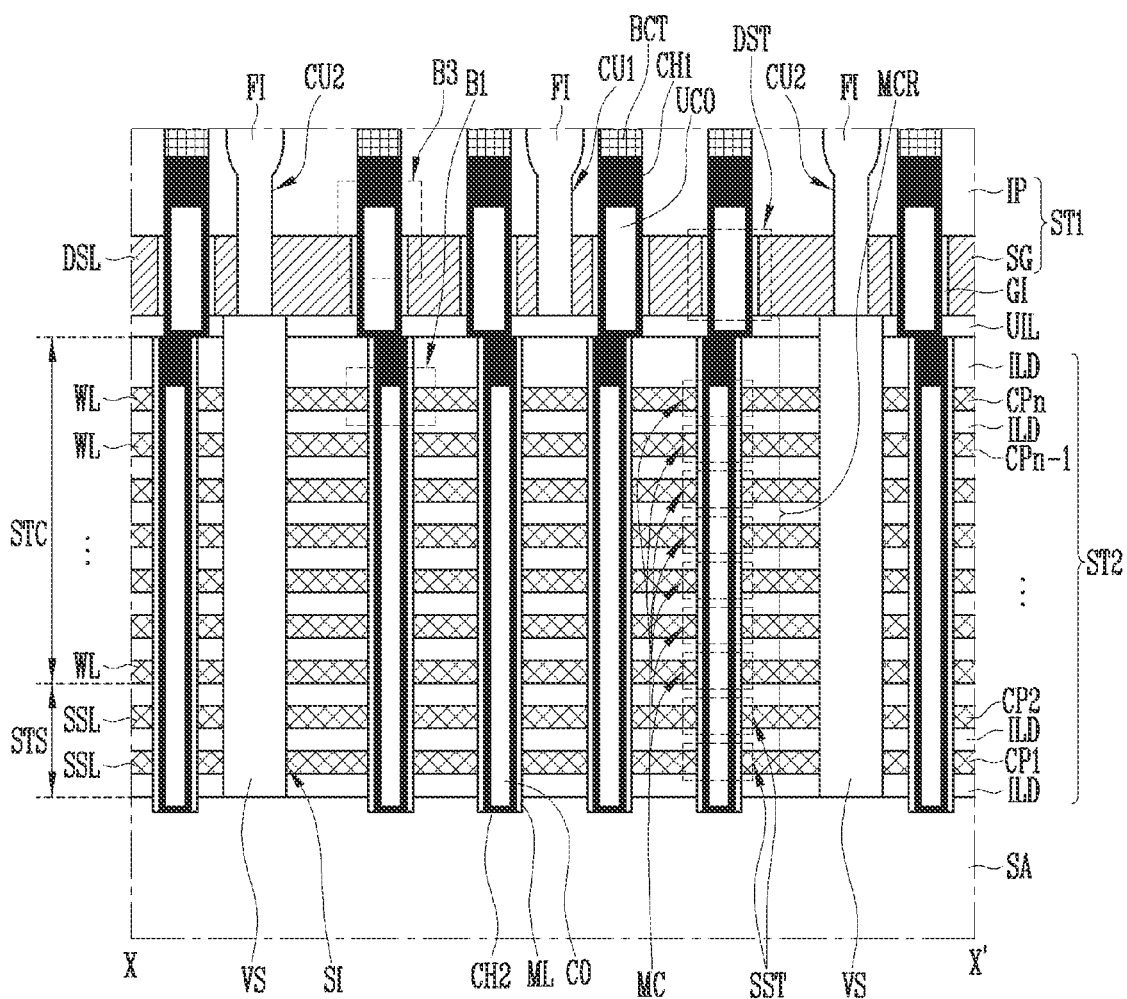
FIGS. 6A and 6B are cross-sectional diagrams illustrating semiconductor devices according to embodiments.
Figure 6B:
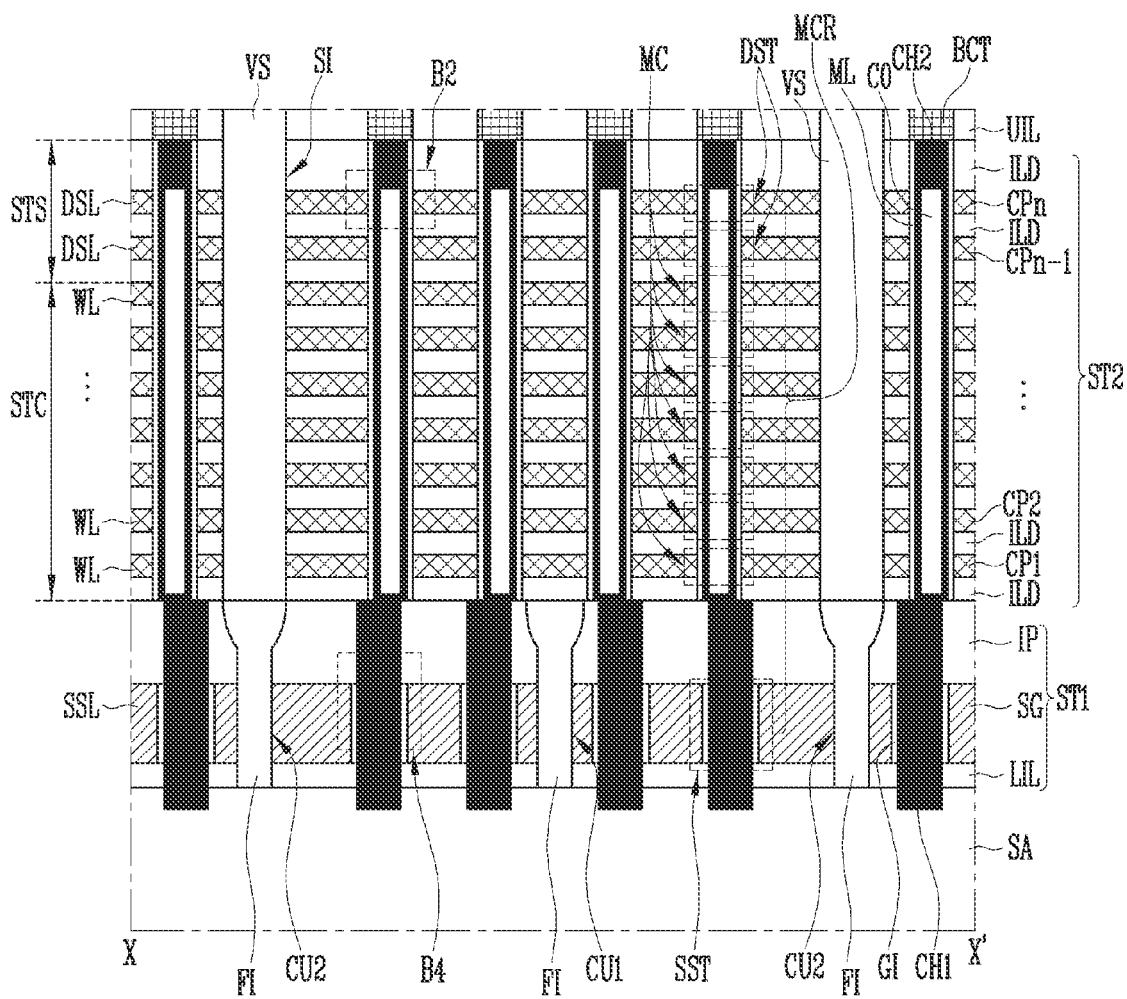

FIGS. 6A and 6B are cross-sectional diagrams illustrating semiconductor devices according to embodiments. FIGS. 6A and 6B are cross-sectional diagrams taken along line X-X' shown in FIG. 5. FIG. 6A illustrates an embodiment in which a second stack structure is disposed above a first stack structure, and FIG. 6B illustrates an embodiment in which a second stack structure is disposed under a first stack structure.

Referring to FIGS. 6A and 6B, each of the first stack structures ST1 may serve as a first select stack structure. Each of the first stack structures ST1 may include a select gate SG and an insulating pattern IP on the select gate SG. The select gate SG may serve as a drain select line DSL as shown in FIG. 6A, or may serve as a source select line SSL as shown in FIG. 6B. The select gate SG may include at least one of a silicon layer, a metal silicide layer, a metal layer, and a metal nitride layer. The insulating pattern IP may include an oxide layer such as a silicon oxide layer.

The first stack structures ST1 may be separated from each other by the first separation region CU1 or the second separation region CU2. Each of the first separation region CU1 and the second separation region CU2 may be filled with a gap-fill insulating layer FI. The gap-fill insulating layer FI may include an oxide layer such as a silicon oxide layer.

Each of the second stack structures ST2 may include interlayer insulating layers ILD and conductive patterns $CP_1$ to $CP_n$ alternately stacked with each other. The conductive patterns $CP_1$ to $CP_n$ may include at least one of a silicon layer, a metal silicide layer, a metal layer, and a metal nitride layer. The interlayer insulating layers ILD may include silicon oxide layers. The interlayer insulating layers ILD and the conductive patterns $CP_1$ to $CP_n$ included in each of the second stack structures ST2 may be divided into a cell stack structure STC and a second select stack structure STS.

The cell stack structure STC may be disposed on the second select stack structure STS as shown in FIG. 6A, or may be disposed under the second select stack structure STS as shown in FIG. 6B. In other words, the cell stack structure STC may be disposed between the first stack structures ST1 which is a first select stack structure and the second select stack structure STS.

Each of the second stack structures ST2 may be covered by an upper insulating layer UIL. The upper insulating layer UIL may include a silicon oxide layer. The second stack structures ST2 may be separated from each other by the slits SI. Each of the second stack structures ST2 may overlap the corresponding first separation region CU1.

The slits SI may overlap the second separation regions CU2, respectively, and may be filled with vertical structures VS, respectively. Each of the vertical structures VS may include an oxide layer. Each of the vertical structures VS may be a pickup conductive pattern of which a sidewall is surrounded with an insulating layer. The slits SI and the vertical structures VS may extend to pass through the upper insulating layer UIL.

The first channel structures CH1 may be disposed in the first stack structures ST1. Each of the first channel structures CH1 may pass through the corresponding select gate SG.

A gate insulating layer GI may be disposed between each of the first channel structures CH1 and the corresponding select gate SG. The gate insulating layer GI may include a silicon oxide layer. The gate insulating layer GI may include an oxide of the select gate SG.

Each of the first channel structures CH1 may extend into the insulating pattern IP, and may protrude farther towards the insulating pattern IP than the select gate SG. The first channel structures CH1 may be disposed in the insulating pattern IP not to completely pass through the insulating pattern IP as shown in FIG. 6A. Alternatively, the first channel structures CH1 may extend to completely pass through the insulating pattern IP as shown in FIG. 6B.

The second channel structures CH2 may pass through the second stack structures ST2. A sidewall of each of the second channel structures CH2 may be surrounded with a memory layer ML. A core insulating layer CO may be disposed at a central region of each of the second channel structures CH2.

Referring to FIG. 6A, the first channel structures CH1 passing through the drain select line DSL may pass through the upper insulating layer UIL disposed under the drain select line DSL to be coupled to the second channel structures CH2, respectively. A central region of each of the first channel structures CH1 may be filled with an upper core insulating layer UCO.

The first channel structures CH1 may be coupled to bit contact plugs BCT, respectively. The bit contact plugs BCT may be disposed in the insulating pattern IP to contact top surfaces of the first channel structures CH1. Although not illustrated in FIG. 6A, bit lines may be disposed above the bit contact plugs BCT in various layouts. The bit contact plugs BCT may be formed to electrically couple the first channel structures CH1 to the bit lines (not illustrated).

The second channel structures CH2 coupled to the first channel structures CH1 under the first channel structures CH1 may contact a common source region SA. The common source region SA may be disposed under the second stack structures ST2. The common source region SA may be a portion of the substrate SUB shown in FIG. 1A. For example, the common source region SA may be defined by injecting a source dopant into the substrate SUB shown in FIG. 1A. The source dopant may be an n-type dopant. According to other embodiments, the common source region SA may be a doped semiconductor layer deposited on the peripheral circuit structure PC shown in FIG. 1B.

The conductive patterns $CP_1$ to $CP_n$ enclosing the second channel structures CH2 may serve as word lines WL or at least one of the source select lines SSL. For example, the lowermost conductive pattern $CP_1$ adjacent to the common source region SA may serve as the source select line SSL, or each of the lowermost conductive pattern $CP_1$ and one or more conductive patterns successively disposed on the lowermost conductive pattern $CP_1$ (for example, the conductive pattern $CP_2$) may serve as the source select line SSL. The word lines WL may be disposed between the drain select line DSL and at least one of the source select lines SSL.

Referring to FIG. 6B, the first channel structures CH1 passing through the source select line SSL may pass through a lower insulating layer LIL disposed under the source select line SSL to be coupled to the common source region SA. Each of the first channel structures CH1 may include a doped semiconductor layer.

The lower insulating layer LIL may be disposed at the lowermost layer of the first stack structure ST1. The lower insulating layer LIL may be disposed between the source select line SSL and the common source region SA. The common source region SA disposed under the first stack structure ST1 may be defined by injecting a source dopant into the substrate SUB shown in FIG. 1A as described above with reference to FIG. 6A, or may be a doped semiconductor layer deposited on the peripheral circuit structure PC shown in FIG. 1B.

The second channel structures CH2 passing through the second stack structure ST2 may be coupled to the first channel structures CH1 disposed under the second stack structure ST2, respectively. The second channel structures CH2 may be coupled to the bit contact plugs BCT, respectively. The bit contact plugs BCT may pass through the upper insulating layer UIL covering the second stack structure ST2. Although not illustrated in FIG. 6B, bit lines may be disposed above the bit contact plugs BCT. The bit lines may be formed in various layouts. The bit contact plugs BCT may be formed to electrically couple the second channel structures CH2 to the bit lines (not illustrated).

The conductive patterns $CP_1$ to $CP_n$ enclosing the second channel structures CH2 may serve as the word lines WL or at least one of the drain select lines DSL. For example, the uppermost conductive pattern $CP_n$ adjacent to the bit contact plugs BCT may serve as the drain select line DSL, or each of the uppermost conductive pattern $CP_n$ and one or more conductive patterns successively disposed under the uppermost conductive pattern $CP_n$ (for example, $CP_{n-1}$) may serve as the drain select line DSL. The word lines WL may be disposed between at least one of the drain select lines DSL and the source select line SSL.

A plurality of cell strings MCR which constitute the cell array CAR shown in FIGS. 1A and 1B may be formed by using the structures shown in FIGS. 6A and 6B. Each of the cell strings MCR may include at least one source select transistor SST, at least one drain select transistor DST, and memory cells MC coupled in series between the source select transistor SSL and the drain select transistor DST.

The source select line SSL may serve as a gate electrode of the source select transistor SST and the drain select line DSL may serve as a gate electrode of the drain select transistor DST, and the word lines WL may serve as gate electrodes of the memory cells MC. The first channel structures CH1 and the second channel structures CH2 may serve as channels of the cell strings MCR, respectively.

Figure 7A:
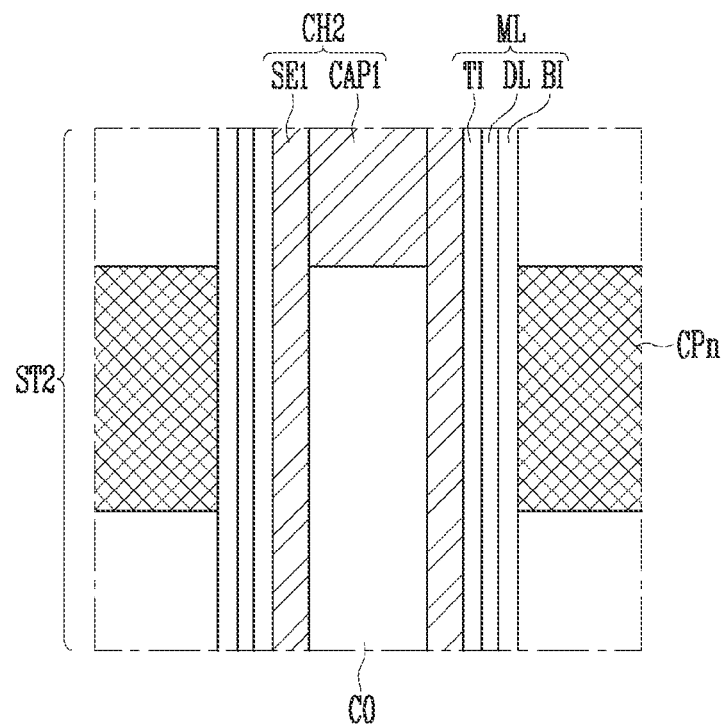
FIGS. 7A to 7C are enlarged cross-sectional diagrams illustrating some regions of semiconductor devices according to embodiments.
Figure 7B:
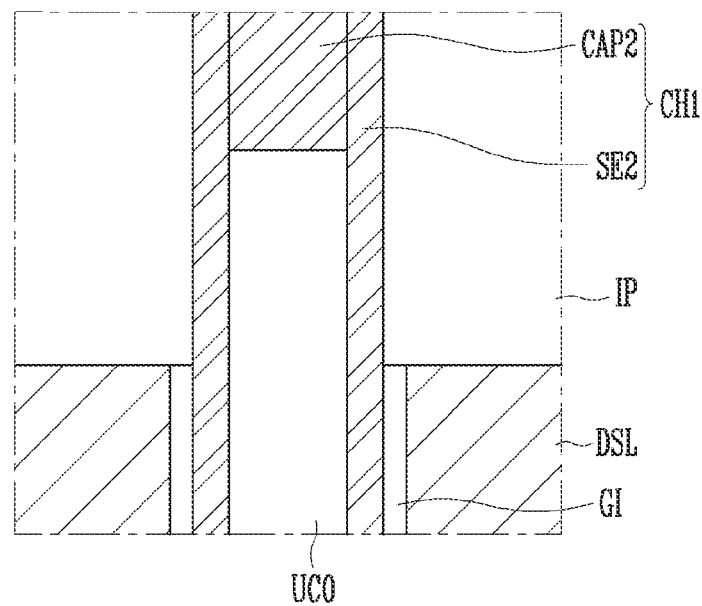
Figure 7C:
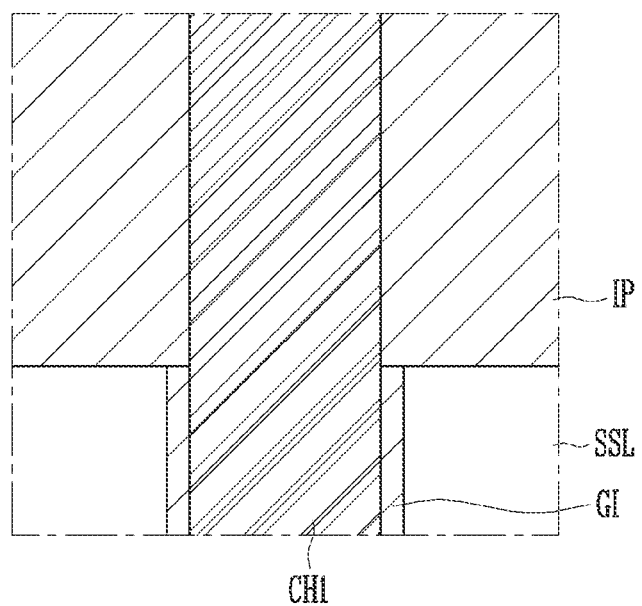

FIGS. 7A to 7C are enlarged cross-sectional diagrams illustrating some regions of semiconductor devices according to embodiments. For example, FIG. 7A is an enlarged cross-sectional diagram of a first box region B1 shown in FIG. 6A or a second box region B2 shown in FIG. 6B. FIG. 7B is an enlarged cross-sectional diagram of a third box region 63 shown in FIG. 6A. FIG. 7C is an enlarged cross-sectional diagram of a fourth box region B4 shown in FIG. 6B.

Referring to FIG. 7A, the second channel structure CH2 enclosing the core insulating layer CO may include a first semiconductor layer SE1 and a first capping pattern CAP1. The first semiconductor layer SE1 may include a semiconductor material such as a silicon layer and may extend along a sidewall and a bottom surface of the core insulating layer CO shown in FIG. 6A or 6B.

The core insulating layer CO may have a lesser height than the first semiconductor layer SE1. The first capping pattern CAP1 may be surrounded by an upper end of the first semiconductor layer SE1 protruding farther than the core insulating layer CO and may be disposed on the core insulating layer CO.

The first capping pattern CAP1 may contact the first semiconductor layer SE1. The first capping pattern CAP1 may include a doped semiconductor layer doped with a dopant. For example, the first capping pattern CAP1 may include a doped silicon layer including an n-type dopant.

The first capping pattern CAP1 may extend to be adjacent to the uppermost conductive pattern $CP_n$ of the second stack structure ST2.

The memory layer ML may extend along an interface between the second stack structure ST2 and the second channel structure CH2. The memory layer ML may include a tunnel insulating layer TI configured to enclose the second channel structure CH2, a data storage layer DL configured to enclose the tunnel insulating layer TI, and a blocking insulating layer BI configured to enclose the data storage layer DL.

The data storage layer DL may include a charge trapping layer, a material layer including a conductive nanodot, or a phase-change material layer.

The data storage layer DL may store data being changed by using Fowler-Nordheim tunneling induced by the voltage difference between each of the word lines WL shown in FIG. 6A or 6B, and the second channel structure CH2. The data storage layer DL may include a silicon nitride layer capable of trapping charges.

The data storage layer DL may store data based on an operating principal other than Fowler-Nordheim tunneling. For example, the data storage layer DL may include a phase-change material layer and may store data according to a phase change.

The blocking insulating layer BI may include an oxide layer capable of blocking charges. The tunnel insulating layer TI may include a silicon oxide layer in which charge tunneling is available.

Referring to FIG. 7B, the first channel structure CH1 passing through the drain select line DSL may include a second semiconductor layer SE2 enclosing the upper core insulating layer UCO and a second capping pattern CAP2. The second semiconductor layer SE2 may include a semiconductor material such as silicon, and may extend along a sidewall and a bottom surface of the upper core insulating layer UCO shown in FIG. 6A. The second semiconductor layer SE2 may extend into the insulating pattern IP on the drain select line DSL. The gate insulating layer GI may be disposed between the drain select line DSL and the first channel structure CH1.

The upper core insulating layer UCO may have a smaller height than the second semiconductor layer SE2. The second capping pattern CAP2 may be surrounded with an upper end of the second semiconductor layer SE2 protruding farther than the upper core insulating layer UCO and may be disposed on the upper core insulating layer UCO.

The second capping pattern CAP2 may contact the second semiconductor layer SE2. The second capping pattern CAP2 may include a doped semiconductor layer doped with a dopant. For example, the second capping pattern CAP2 may include a doped semiconductor layer including an n-type dopant.

Referring to FIG. 7C, the first channel structure CH1 passing through the source select line SSL may be formed as a pillar-shaped semiconductor layer. The pillar-shaped semiconductor layer may include a dopant. For example, a pillar-shaped semiconductor layer may include a doped silicon layer including an n-type dopant. The first channel structure CH1 may extend into the insulating pattern IP on the source select line SSL. The gate insulating layer GI may be disposed between the source select line SSL and the first channel structure CH1.

Figure 8A:
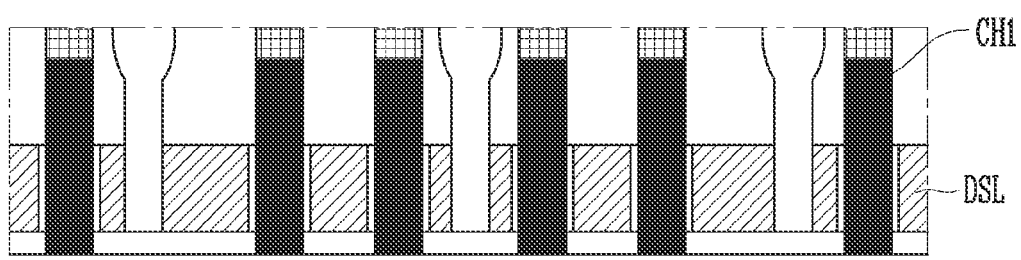
FIGS. 8A and 8B are cross-sectional diagrams illustrating examples of variations of first channel structures according to embodiments.
Figure 8B:
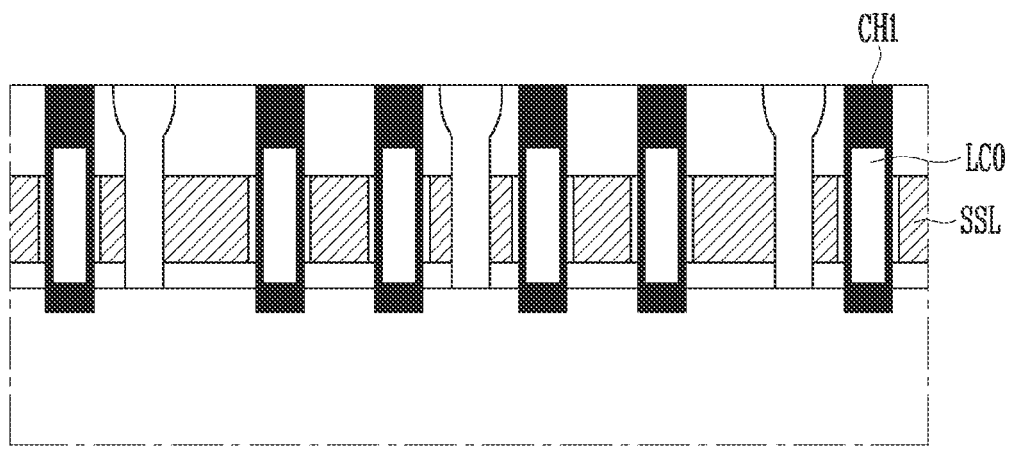

FIGS. 8A and 8B are cross-sectional diagrams illustrating examples of variations of the first channel structures according to embodiments. For example, the first channel structure shown in FIG. 6A may be replaced by the first channel structure shown in FIG. 8A and the first channel structure shown in FIG. 6B may be replaced by the first channel structure shown in FIG. 8B. Hereinafter, any repetitive descriptions of the same structure will be omitted.

Referring to FIG. 8A, the first channel structure CH1 passing through the drain select line DSL may be formed as a pillar-shaped semiconductor layer. The pillar-shaped semiconductor layer may include a dopant. For example, a pillar-shaped semiconductor layer may include a doped silicon layer including an n-type dopant.

Referring to FIG. 8B, the first channel structure CH1 passing through the source select line SSL may enclose a lower core insulating layer LCO. In other words, a central region of the first channel structure CH1 may be filled with the lower core insulating layer LCO. The first channel structure CH1 may include the second semiconductor layer SE2 and the second capping pattern CAP2 as described above with reference to FIG. 7B.

Figure 9:
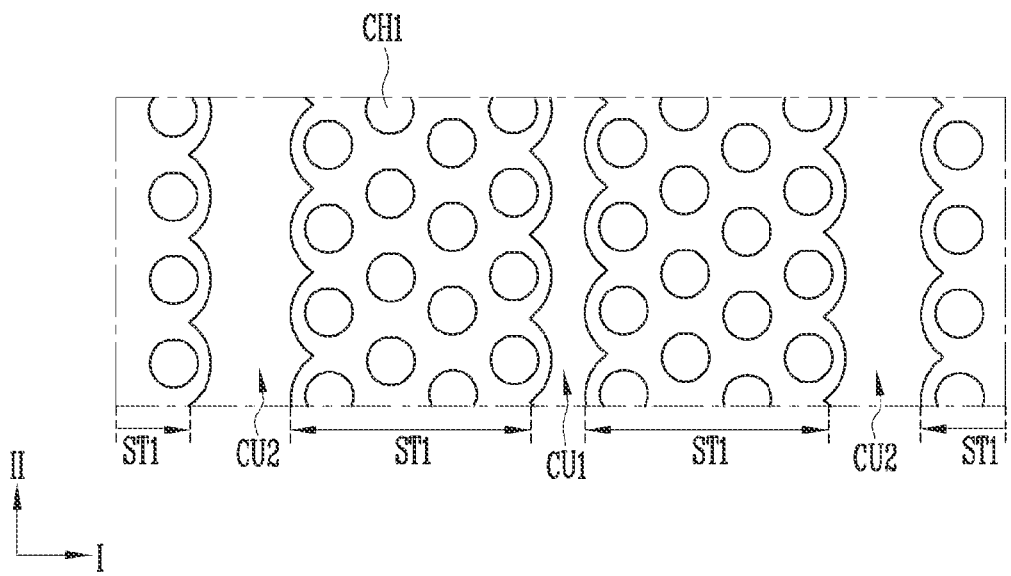
FIG. 9 is a plan view illustrating an example of a variation of first stack structures according to an embodiment.

FIG. 9 is a plan view illustrating an example of a variation of the first stack structures according to an embodiment.

Referring to FIG. 9, the first separation region CU1 or the second separation region CU2 separating the first stack structures ST1 from each other may have a wavy sidewall defined along outlines of the first channel structures CH1. In other embodiments, the first separation region CU1 or the second separation region CU2 which is shown in FIG. 3A or 5 may have a straight sidewall extending in the second direction II.

The manufacturing method of a semiconductor device according to the embodiments as described above may include forming the first stack structures penetrated by the first channel structures and forming the second stack structures penetrated by the second channel structures. The second stack structures penetrated by the second channel structures may be formed before or after forming the first stack structures penetrated by the first channel structures.

Figure 10:
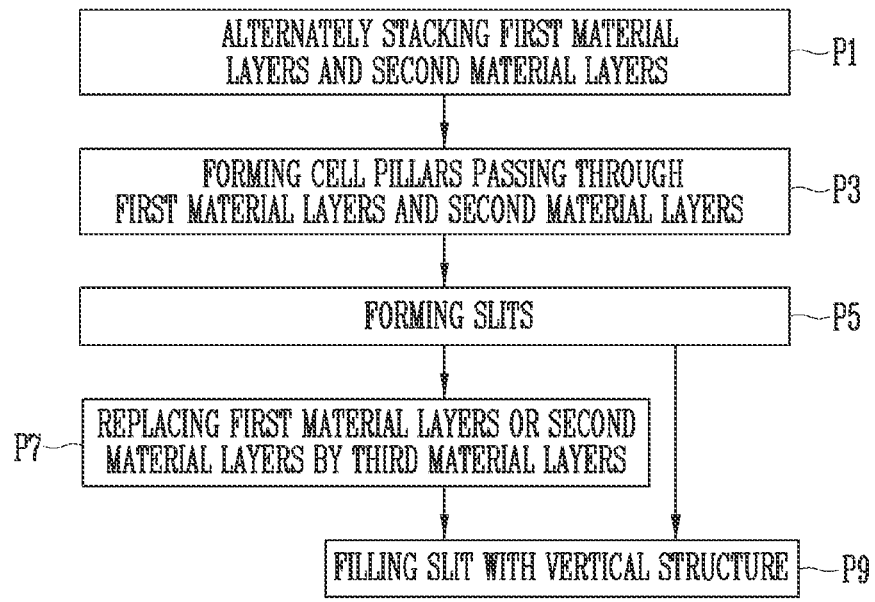
FIG. 10 is a flowchart illustrating a process of forming stack structures penetrated by cell pillars and spaced apart from each other by vertical structures.

FIG. 10 is a flowchart illustrating a process of forming stack structures penetrated by cell pillars and separated apart from each other by vertical structures. The process shown in FIG. 10 may correspond to a forming process of second stack structures penetrated by second channel structures.

Referring to FIG. 10, step P1 for alternately stacking first material layers and second material layers may be performed. The first material layers may include a different material from the second material layers.

According to an embodiment, first material layers may include an insulating material for an interlayer insulating layer, and second material layers may include a sacrificial material having a different etch rate from the first material layers. The first material layers may include a silicon oxide layer, and the second material layers may include a silicon nitride layer.

According to other embodiments, second material layers may include a conductive material for conductive patterns, and the first material layers may include a sacrificial material having a different etch rate from the second material layers. The first material layers may include an undoped silicon layer and the second material layers may include a doped silicon layer.

According to other embodiments, first material layers may include an insulating material for an interlayer insulating layer, and second material layers may include a conductive material for conductive patterns. The first material layers may include a silicon oxide layer, and the second material layers may include at least one of a doped silicon layer, a metal silicide layer, a metal layer, and a metal nitride layer.

After step P1, step P3 for forming cell pillars passing through the first material layers and the second material layers may be performed.

Step P5 for forming a slit may be performed following step P3. After step P5, steps P7 and P9 may be sequentially performed or step P9 may be performed while skipping step P7 depending on the composition of materials of the first material layers and the second material layers.

According to an embodiment, when first material layers include an insulating material for an interlayer insulating layer, and second material layers include a sacrificial material, the second material layers may be replaced by third material layers through slits during step P7. For example, an etching material may flow in through slits to selectively remove second material layers. Damage to the first material layers may be minimized by using a difference in etch rate between the first material layers and the second material layers. Subsequently, regions from which the second material layers are removed may be filled with the third material layers. The third material layers may be a conductive material for conductive patterns.

According to other embodiments, when second material layers include a conductive material for conductive patterns and first material layers include a sacrificial material having a different etch rate from the second material layers, the first material layers may be replaced by third material layers through slits during step P7. For example, an etching material may flow in through slits to selectively remove the first material layers. Damage to the second material layers may be minimized by using a difference in etch rate between the first material layers and the second material layers. Subsequently, regions from which the first material layers are removed may be filled with the third material layers. The third material layers may be an insulating material for an interlayer insulating layer.

According to other embodiments, when first material layers include an insulating material for an interlayer insulating layer and second material layers include a conductive material for conductive patterns, step P7 may be omitted.

After forming stack structures each configured such that interlayer insulating layers and conductive patterns are alternately stacked with each other by the various embodiments described above, the slit may be filled with a vertical structure during step P9.

Figure 11:
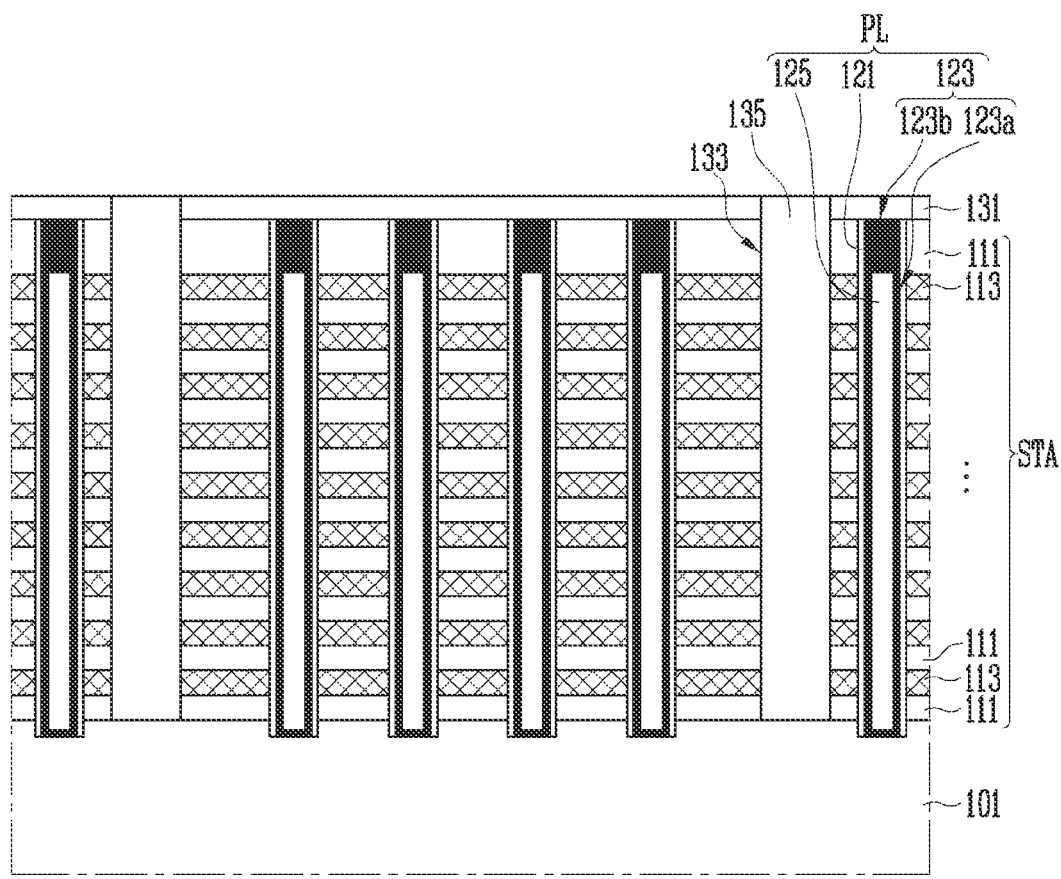
FIG. 11 is a cross-sectional diagram illustrating an embodiment of the stack structures formed using the process illustrated in FIG. 10.

FIG. 11 is a cross-sectional diagram illustrating an embodiment of stack structures formed using the process illustrated in FIG. 10.

Referring to FIG. 11, stack structures STA may be formed on a common source region 101. The common source region 101 may include a doped semiconductor material. For example, the common source region 101 may be defined by injecting an n-type dopant into a single crystal silicon substrate. In other examples, the common source region 101 may be a doped silicon layer stacked on the peripheral circuit structure PC shown in FIG. 1B. The doped silicon layer may include an n-type dopant.

Each of the stack structures STA may include interlayer insulating layers 111 and conductive patterns 113 alternately stacked with each other. The conductive patterns 113 may correspond to the word lines WL and the source select line SSL which are shown in FIG. 6A. The stack structures STA may be penetrated by cell pillars PL formed using the process described above in FIG. 10, respectively, and may be separated from each other by slits 133.

Each of the cell pillars PL may include a memory layer 121 and a lower channel structure 123. The memory layer 121 may have a tube-shaped structure of which an upper portion and a lower portion are open. The lower channel structure 123 may contact the common source region 101 through the open lower portion of the memory layer 121. The lower channel structure 123 may correspond to the second channel structure CH2 shown in FIG. 6A.

The lower channel structure 123 may include a semiconductor material. The lower channel structure 123 may be divided into a first region 123a and a second region 123b on the first region 123a. The first region 123a and the second region 123b may be formed on an inner sidewall of the memory layer 121. A central region of the first region 123a may be filled with a core insulating layer 125. The second region 123b may be disposed on the first region 123a and the core insulating layer 125. The second region 123b may include a dopant. For example, the second region 123b may include an n-type dopant. The first region 123a and the second region 123b may be embodied by the first semiconductor layer SE1 and the first capping pattern CAP1 which are shown in FIG. 7A.

The stack structures STA penetrated by the cell pillars PL may be covered by an upper insulating layer 131. The upper insulating layer 131 may be formed before a mask pattern. The mask pattern is used as an etch barrier during forming the slits 133 in step P5 shown in FIG. 10. The upper insulating layer 131 may be penetrated by the slits 133.

The slits 133 may be filled with vertical structures 135, respectively. Each of the vertical structures 135 may include a single layer of an oxide layer. Alternatively, each of the vertical structures 135 may be a pickup conductive pattern of which a sidewall is surrounded with an insulating layer.

FIGS. 12A to 12D, 13A, 13B, 14A, 14B, 15A, and 15B are diagrams illustrating a manufacturing method of a semiconductor device according to an embodiment. More particularly, FIGS. 12A to 12D, 13A, 13B, 14A, 14B, 15A, and 15B are diagrams illustrating processes for forming line patterns on the stack structures shown in FIG. 11.

FIGS. 12A to 12D are cross-sectional diagrams illustrating processes for forming upper channel structures passing through a conductive layer and protruding farther than the conductive layer.

Figure 12A:
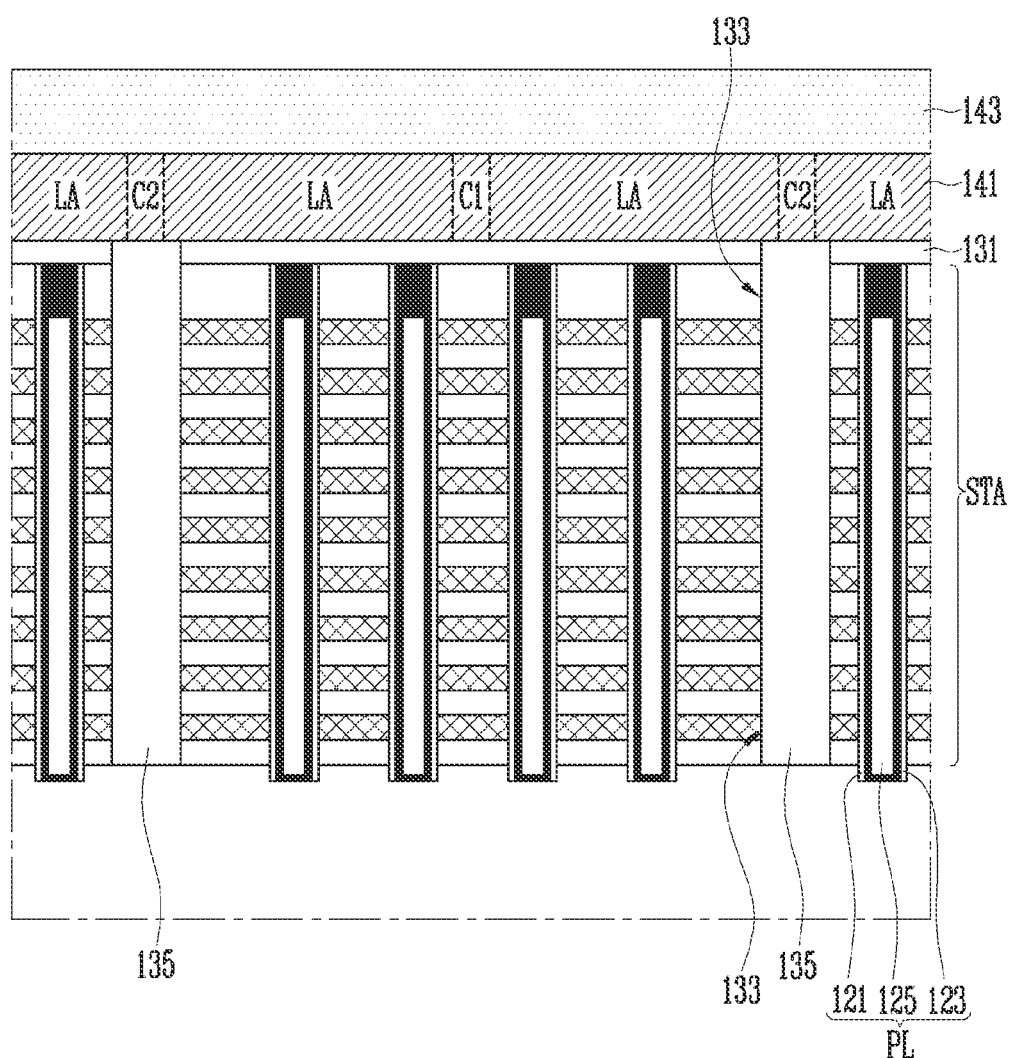
FIGS. 12A to 12D, 13A, 13B, 14A, 14B, 15A, and 15B are diagrams illustrating a manufacturing method of a semiconductor device according to an embodiment.

Referring to FIG. 12A, a conductive layer 141 may be formed on the stack structures STA covered with the upper insulating layer 131. The conductive layer 141 may include various conductive materials. For example, the conductive layer 141 may include a polys con layer.

The conductive layer 141 may include line regions LA and etching regions C1 and C2 alternately disposed with each other. The etching regions C1 and C2 may be divided into the first etching regions C1 overlapping the stack structures STA and the second etching regions C2 overlapping the slits 133 or the vertical structures 135. The line regions LA may be overlapped by the cell pillars PL. In other words, the line regions LA may overlap the lower channel structures 123.

A mask layer 143 may be formed on the conductive layer 141. The mask layer 143 may include a material having a different etch rate from the conductive layer 141. For example, the mask layer 143 may include a nitride layer.

Figure 12B:
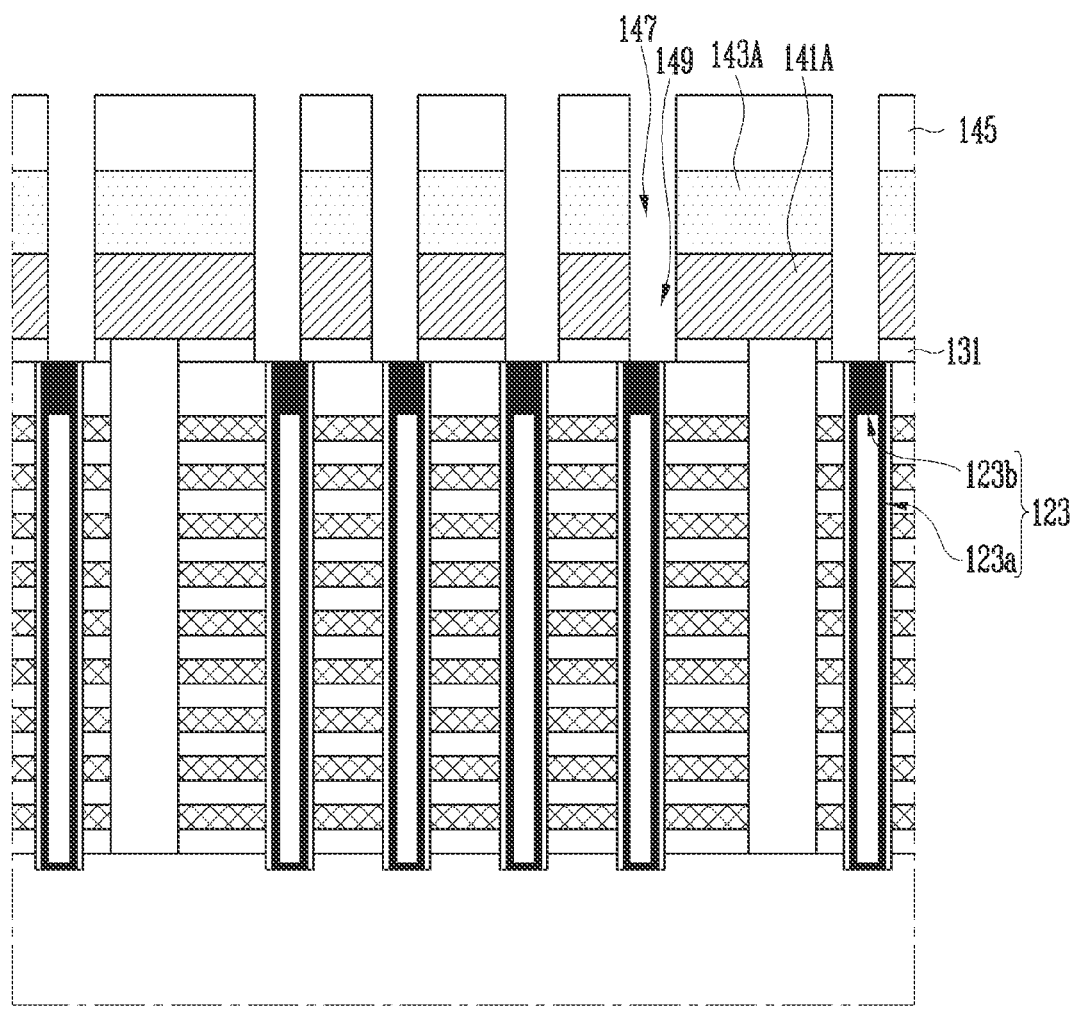

Referring to FIG. 12B, a photoresist pattern 145 may be formed on the mask layer 143 shown in FIG. 12A by using a photolithography process. Subsequently, first holes 147 passing through the mask layer 143 may be formed by etching a portion of the mask layer 143 which is not blocked by the photoresist pattern 145. Hereinafter, the mask layer 143 penetrated by the first holes 147 may be defined as a mask pattern 143A.

As described above, after forming the mask pattern 143A, a conductive layer 141A penetrated by second holes 149 may be formed by etching the conductive layer 141 of FIG. 12A exposed through the first holes 147. The second holes 149 may extend to pass through the upper insulating layer 131. The second holes 149 may expose the lower channel structures 123. The second holes 149 may be arranged to pass through the line regions LA shown in FIG. 12A.

Figure 12C:
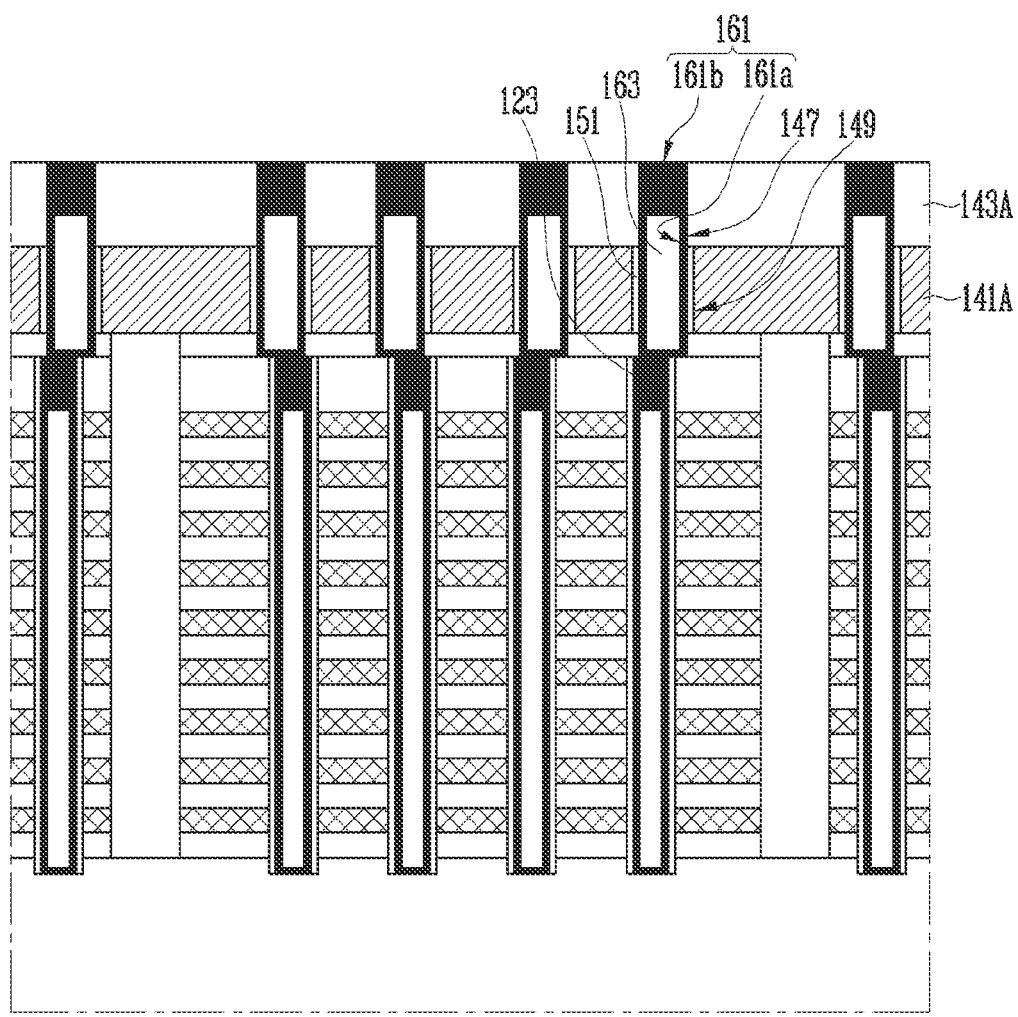

Referring to FIG. 12C, after forming the second holes 149, the photoresist pattern 145 shown in FIG. 12B may be removed. Subsequently, gate insulating layers 151 may be formed on sidewalls of the second holes 149, respectively. The gate insulating layers 151 may extend to sidewalls of the first holes 147, respectively.

Each of the gate insulating layers 151 may be formed by oxidizing a sidewall of the conductive layer 141A which is exposed by the second holes 149. During an oxidizing process, a sidewall of the mask pattern 143A which is exposed by each of the first holes 147 may be oxidized. In other examples, the gate insulating layers 151 may be formed by depositing an oxide layer on sidewalls of the first holes 147 and the second holes 149.

Thereafter, upper channel structures 161 may be formed in the second holes 149. The upper channel structures 161 may extend into the first holes 147. The upper channel structures 161 may contact the lower channel structures 123, respectively. The upper channel structures 161 may include a semiconductor material. Each of the upper channel structures 161 may be divided into a first region 161a and a second region 161b on the first region 161a. The first region 161a and the second region 161b may be formed on an inner sidewall of the gate insulating layer 151. A central region of the first region 161a may be filled with an upper core insulating layer 163. The second region 161b may be disposed on the first region 161a and the upper core insulating layer 163. The second region 161b may include a dopant. For example, the second region 161b may include an n-type dopant.

The above-described process of forming the upper channel structures 161 may include forming a semiconductor layer on the gate insulating layer 151, filling a central region of each of the first holes 147 and a central region of each of the second holes 149 which are exposed by the semiconductor layer with the upper core insulating layer 163, recessing an upper end of the upper core insulating layer 163 to open a portion of each of the first holes 147, filling the open region of each of the first holes 147 with a doped semiconductor layer, and planarizing a surface of the doped semiconductor layer to expose a top surface of the mask pattern 143A. The semiconductor layer formed on the gate insulating layer 151 may correspond to the second semiconductor layer SE2 shown in FIG. 7B. The doped semiconductor layer filling the open region of each of the first holes 147 may correspond to the second capping pattern CAP2 shown in FIG. 7B.

The upper channel structures 161 shown in FIG. 12C may correspond to the first channel structures CH1 shown in FIG. 6A.

Figure 12D:
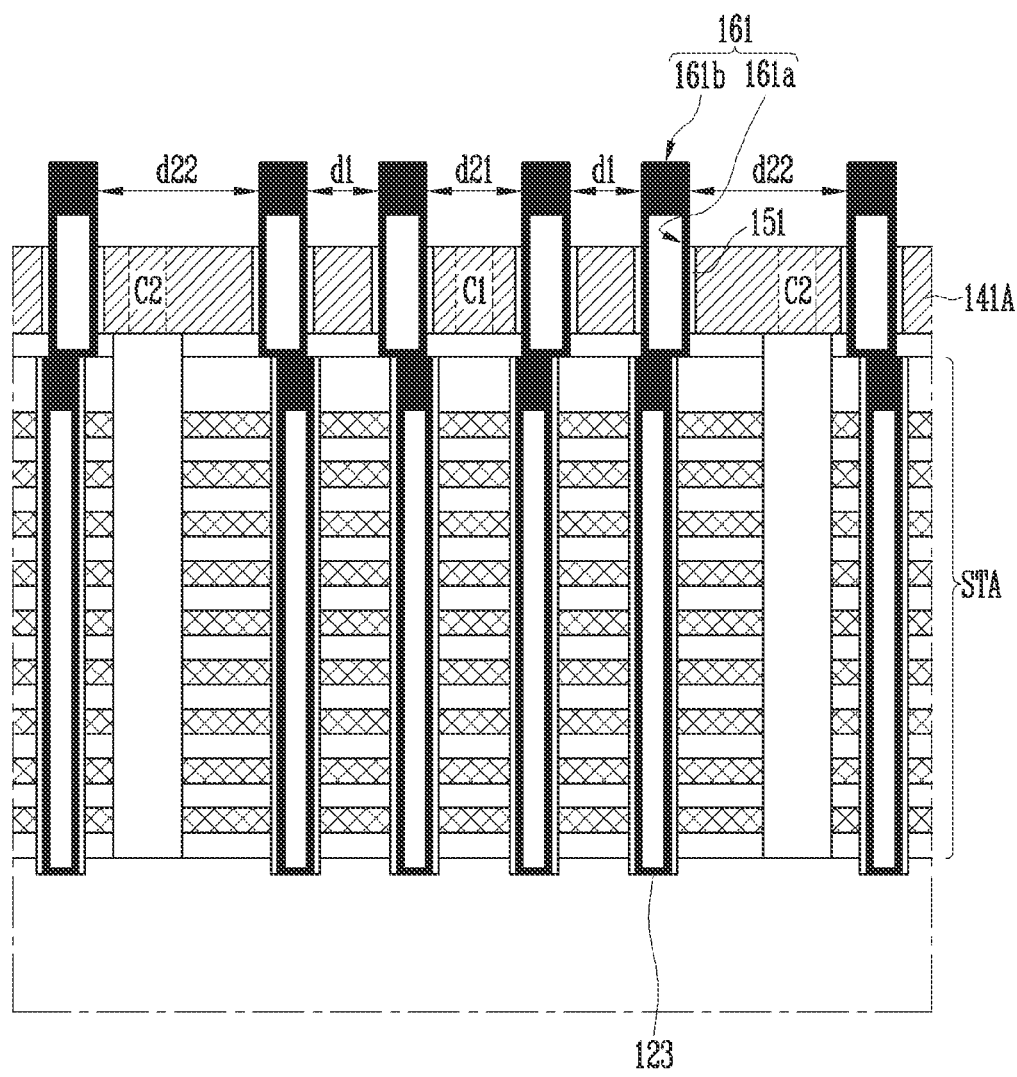

Referring to FIG. 12D, the mask pattern 143A shown in FIG. 12C may be selectively removed. Thereby, spaces between upper ends of the upper channel structures 161 which protrude farther than the conductive layer 141A may be opened. The upper channel structures 161 neighboring each other in each of the line regions LA of FIG. 12A may be spaced apart from each other at a first distance d1. The upper channel structures 161 neighboring each other with the first etching region C1 interposed therebetween may be spaced apart from each other at a second distance d21. The upper channel structures 161 neighboring each other with the second etching region C2 interposed therebetween may be spaced apart from each other at a third distance d22. The second distance d21 may overlap the corresponding stack structure STA. To miniaturize a semiconductor device, the second distance d21 may be smaller than the third distance d22. To divide the conductive layer 141A into line patterns by using a self-aligning method, each of the second distance d21 and the third distance d22 may be greater than the first distance d1.

The lower channel structures 123 coupled to the upper channel structures 161 may be distributed to have a uniform density in each of the stack structures STA. The lower channel structures 123 within each of the stack structures STA may be arranged to have a smaller distance from each other than each of the second distance d21 and the third distance d22.

The upper channel structures 161 may be disposed closer to the second etching regions C2 than the lower channel structures 123. A horizontal distance between the upper channel structures 161 adjacent to the first etching region C1 and the first etching region C1 (i.e., d21) may be greater than a horizontal distance between the lower channel structures 123 adjacent to the first etching region C1 and the first etching region C1.

Figure 13A:
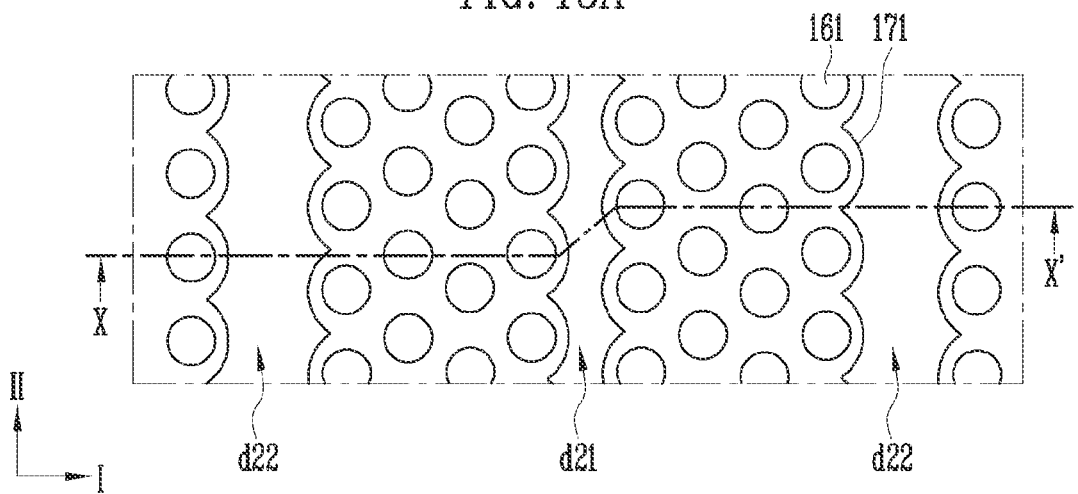
Figure 13B:
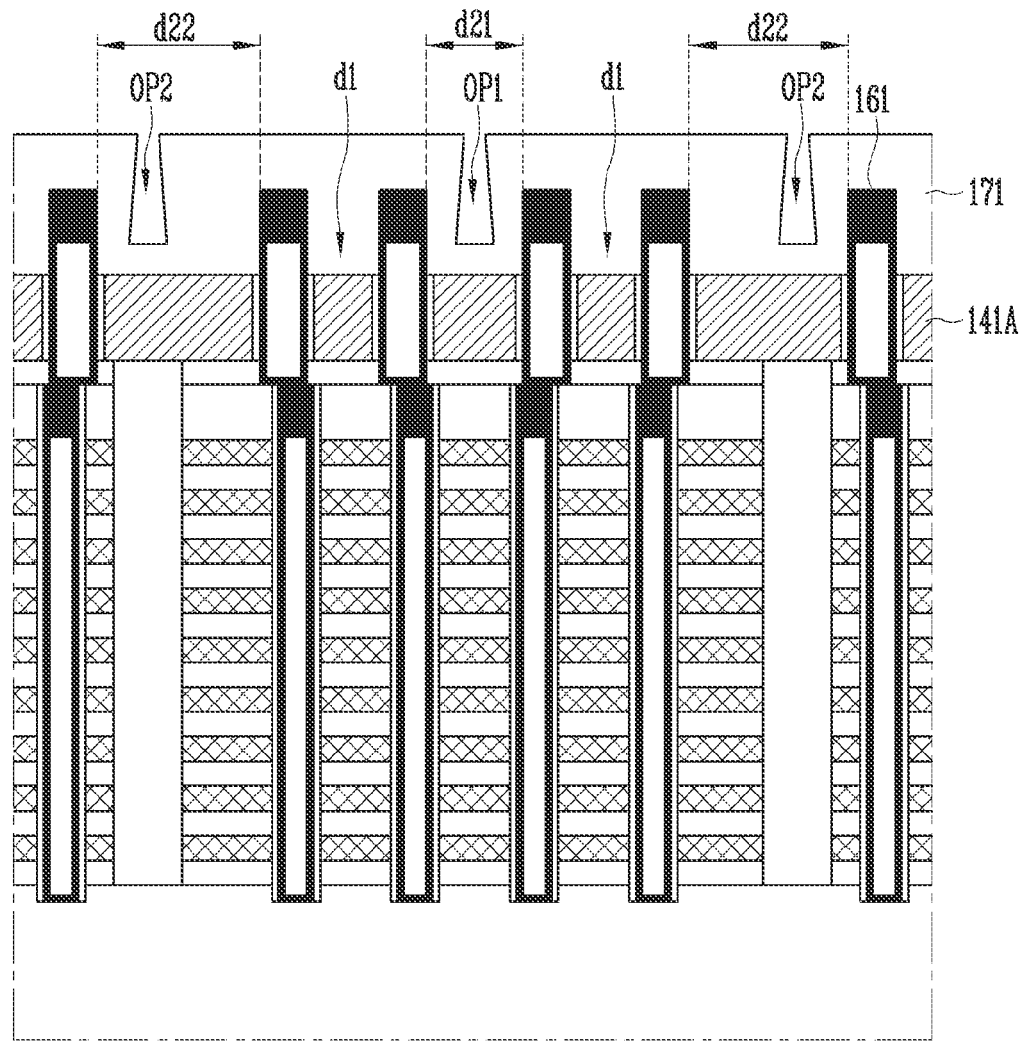

FIGS. 13A and 13B are a plan view and a cross-sectional diagram, respectively, illustrating a process of forming a spacer insulating layer 171.

Referring to FIGS. 13A and 13B, the spacer insulating layer 171 may be formed to cover surfaces of the upper channel structures 161 protruding farther than the conductive layer 141A and a surface of the conductive layer 141A. The spacer insulating layer 171 may include an oxide layer.

The spacer insulating layer 171 may completely fill the first distance d1 which is relatively small compared to the second distance d21 and the third distance d22. The spacer insulating layer 171 may have a thickness to provide openings OP1 and OP2 in the spacer insulating layer 171 within the second distance d21 and the third distance d22. The spacer insulating layer 171 may have a wavy sidewall defined along outlines of the upper channel structures 161. The wavy sidewall may face the second distance d21 and the third distance d22. The wavy sidewall may be located within the second distance d21. The wavy sidewall may be located within the third distance d22.

Figure 14A:
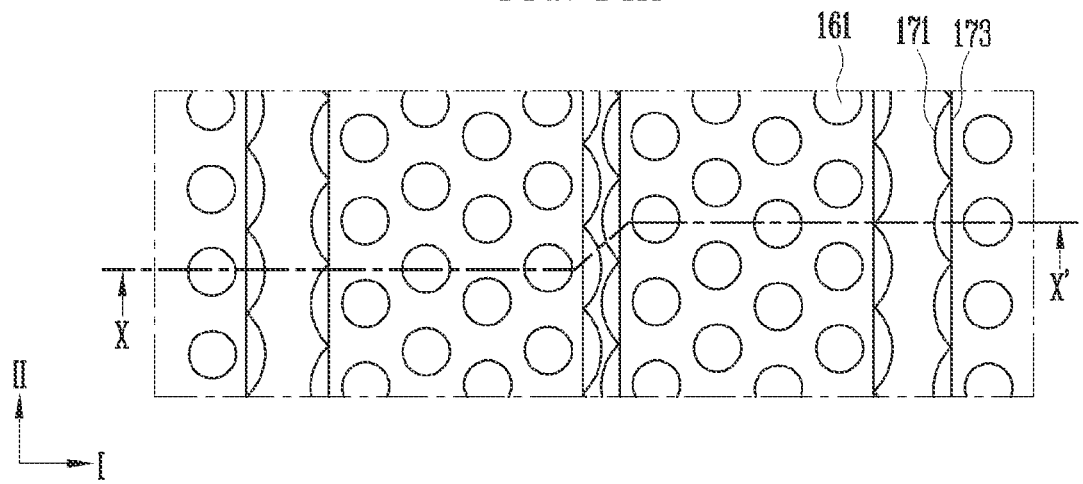
Figure 14B:
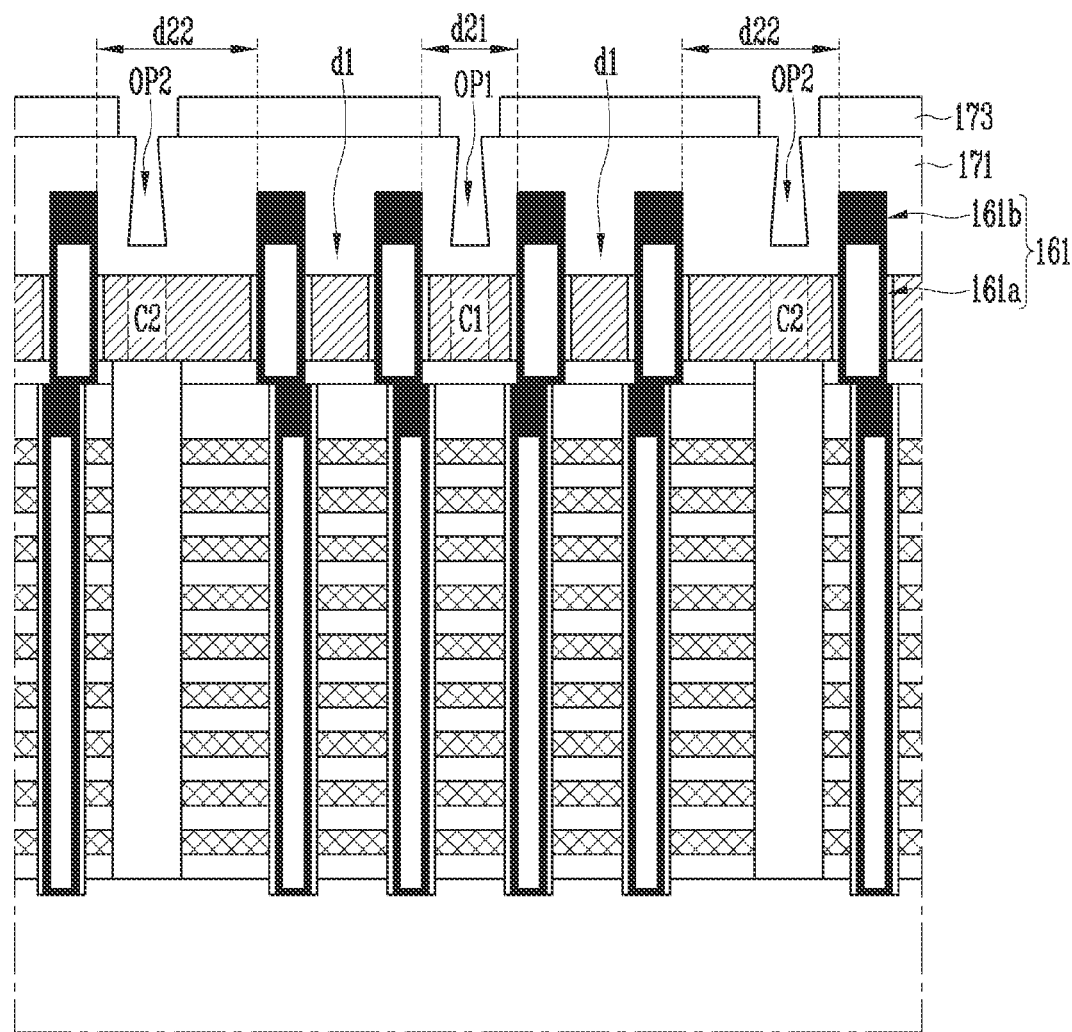

FIGS. 14A and 14B are a plan view and a cross-sectional diagram, respectively, illustrating a process of forming a protective pattern 173.

Referring to FIGS. 14A and 14B, the protective pattern 173 may be further formed on the spacer insulating layer 171. The protective pattern 173 may be a photoresist pattern formed using a photolithography process.

The protective pattern 173 may be patterned to overlap the upper channel structures 161 passing through each of the line regions LA shown in FIG. 12A so that the upper channel structures 161 are protected when a subsequent etching process is performed. The opening OP1 in the second distance d21 and the openings OP2 in the third distance d22 may not be overlapped by the protective pattern 173. Accordingly, the wavy sidewall of the spacer insulating layer 171 may be exposed at both sides of the protective pattern 173.

Figure 15A:
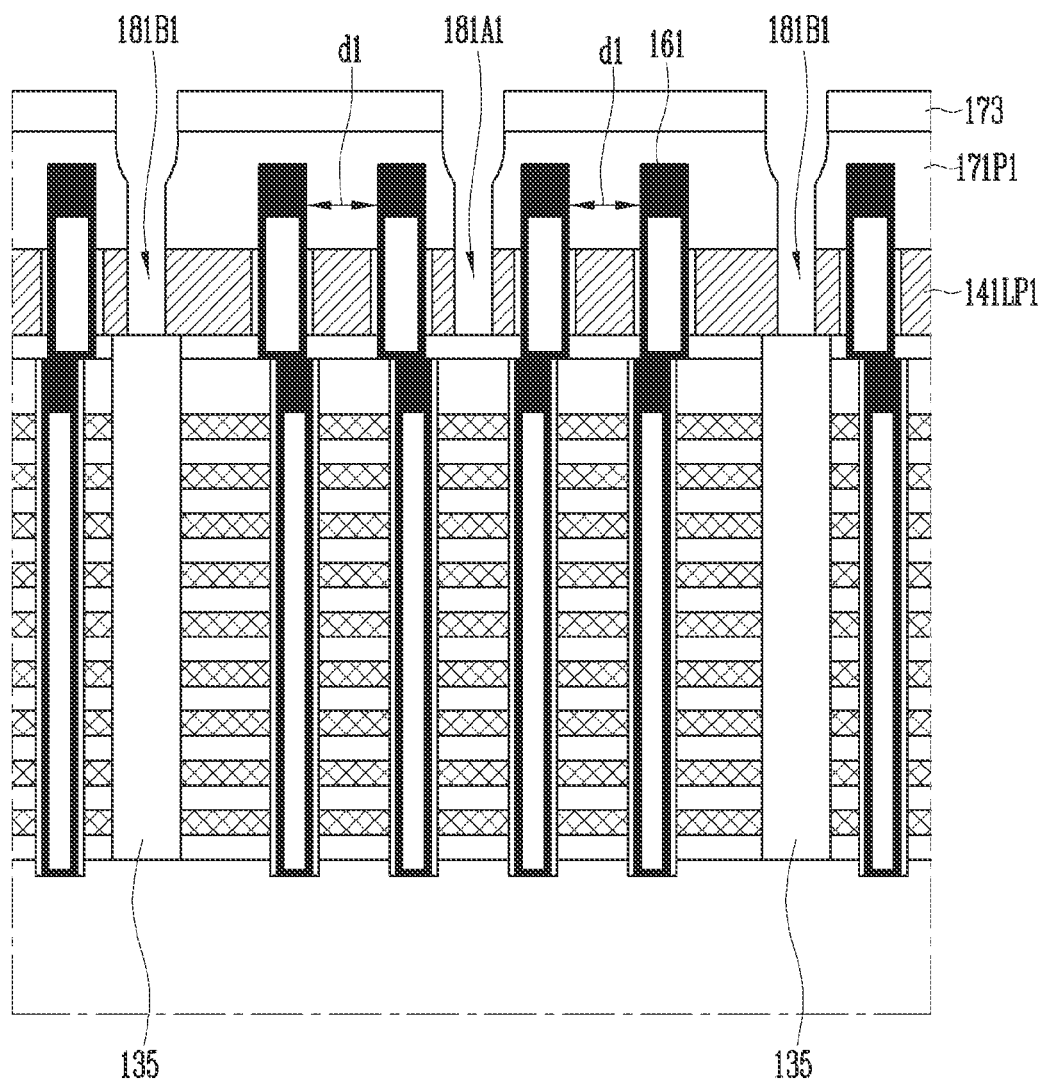
Figure 15B:
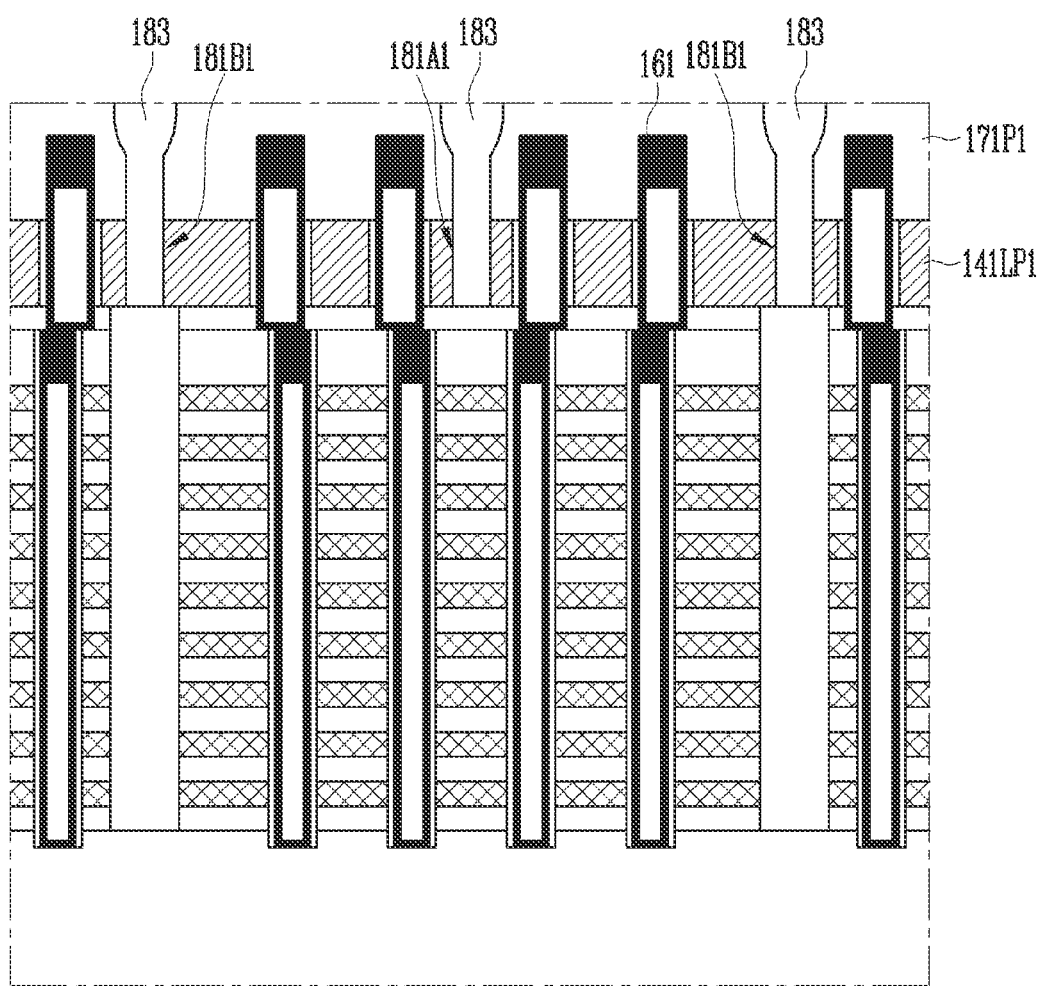

FIGS. 15A and 15B are cross-sectional diagrams illustrating subsequent processes of forming the protective pattern.

Referring to FIG. 15A, insulating patterns 171P1 may be formed by etching the spacer insulating layer 171 shown in FIGS. 14A and 14B. The protective pattern 173 may protect the upper channel structures 161 not to be exposed when the spacer insulating layer 171 is etched.

Each of the insulating patterns 171P1 may remain to fill the first distance d1. The insulating patterns 171P1 may remain to cover sidewalls of the upper channel structures 161. The insulating patterns 171P1 may be patterned such that a conductive layer may be exposed by the opening OP1 within the second distance d21 and the openings OP2 within third distance d22 shown in FIGS. 14A and 14B. Some regions of the conductive layer which are exposed by the insulating patterns 171P1 may be the first etching region C1 and the second etching region C2 shown in FIG. 14A.

Subsequently, the first etching region C1 and the second etching region C2 of the conductive layer which are exposed by the insulating patterns 171P1 may be removed to form a first separation region 181A1 and a second separation region 181B1. The first separation region 181A1 and the second separation region 181B1 may pass through the conductive layer to divide the conductive layer into line patterns 141LP1. Each of the line patterns 141LP1 may correspond to the drain select line DSL shown in FIG. 6A.

The first separation region 181A1 may be defined at a region from which the first etching region C1 is removed, and the second separation region 181B1 may be defined at a region from which the second etching region C2 is removed. The first separation region 181A1 and the second separation region 181B1 may correspond to the first separation region CU1 and the second separation region CU2 which have straight sidewalls as illustrated in FIG. 5, respectively.

Referring to FIG. 15B, the protective pattern 173 shown in FIG. 15A may be removed by a stripping process. Thereafter, each of the first separation region 181A1 and the second separation region 181B1 may be filled with a gap-fill insulating layer 183. Forming the gap-fill insulating layer 183 may include forming an oxide layer to completely fill each of the first separation region 181A1 and the second separation region 181B1 and planarizing a surface of the oxide layer.

Thereafter, subsequent processes of forming the bit contact plugs BCT shown in FIG. 6A may be performed.

Figure 16A:
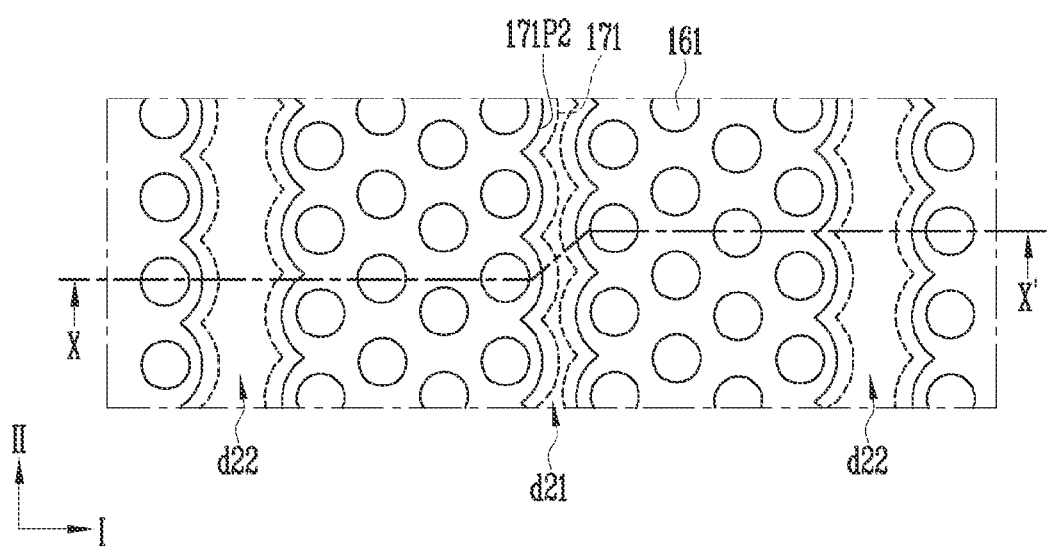
FIGS. 16A and 16B are a plan view and a cross-sectional diagram, respectively, illustrating an example of a variation of a process of forming insulating patterns according to an embodiment.
Figure 16B:
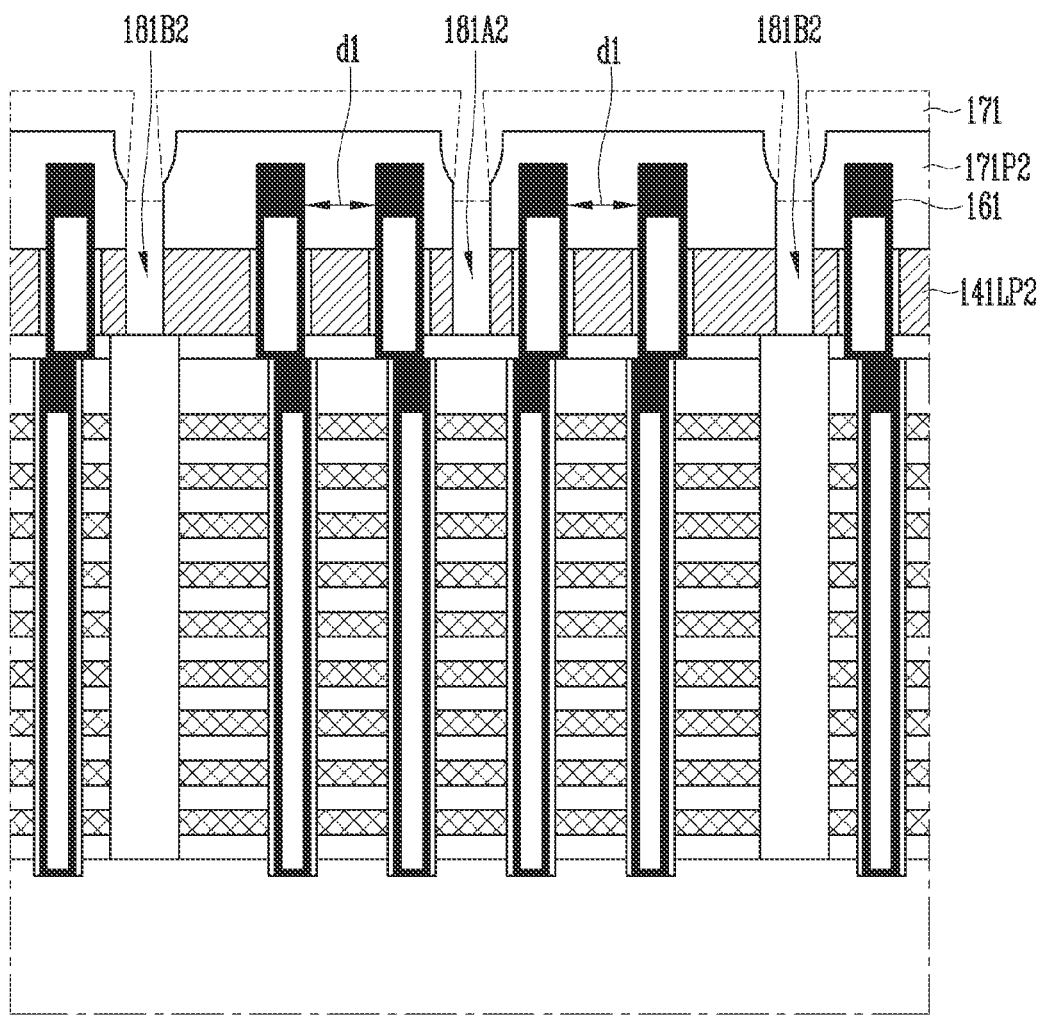

FIGS. 16A and 16B are a plan view and a cross-sectional diagram, respectively, illustrating an example of a variation of a process of forming insulating patterns according to an embodiment.

Referring to FIGS. 16A and 16B, after forming the spacer insulating layer 171 as described above with reference to FIGS. 13A and 13B, the spacer insulating layer 171 may be etched while skipping the process of forming the protective pattern described above with reference to FIGS. 14A and 14B.

The spacer insulating layer 171 having a thickness to completely fill the first distance d1 which is relatively small compared to the second and third distances d21 and d22 and to provide openings within the second distance d21 and the third distance d22 the spacer insulating layer 171 may be etched down from a surface of the spacer insulating layer 171 by an etching process to provide insulating patterns 171P2 having a predetermined thickness and to form insulating patterns 171P2 spaced apart from each other.

Each of the insulating patterns 171P2 may remain to fill the first distance d1. The insulating patterns 171P2 may remain to cover the sidewalk of the upper channel structures 161. The insulating patterns 171P2 may be patterned such that the conductive layer is exposed by the openings OP1 and OP2 within the second distance d21 and the third distance d22 shown in FIGS. 14A and 14B.

Subsequently, the first etching region and the second etching region of the conductive layer which are exposed by the insulating patterns 171P2 may be removed to form a first separation region 181A2 and a second separation region 181B2. The first separation region 181A2 may be defined at a region from which the first etching region of the conductive layer is removed, and the second separation region 181B2 may be defined at a region from which the second etching region of the conductive layer is removed. The conductive layer may be divided into line patterns 141LP2 by the first separation region 181A2 and the second separation region 181B2. The first separation region 181A2 and the second separation region 181B2 may correspond to the first separation region CU1 and the second separation region CU2 which have wavy sidewalk shown in FIG. 9, respectively.

Subsequently, the process of forming the gap-fill insulating layer 183 shown in FIG. 15B and the subsequent processes of forming the bit contact plugs BCT shown in FIG. 6A may be performed.

FIGS. 17A to 17E are cross-sectional diagrams illustrating a manufacturing method of a semiconductor device according to an embodiment.

Figure 17A:
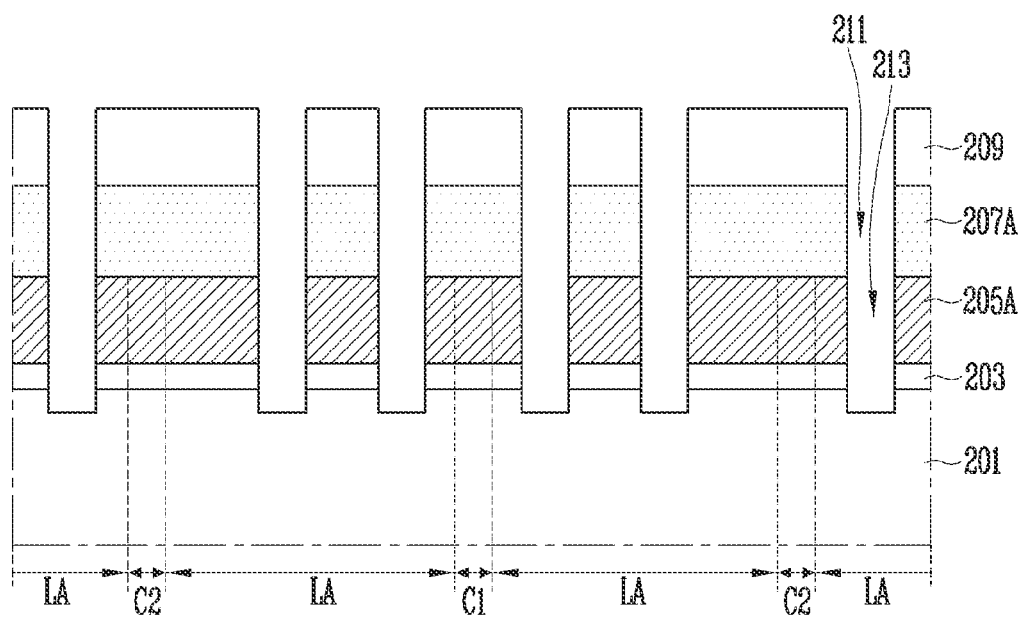
FIGS. 17A to 17E are cross-sectional diagrams illustrating a manufacturing method of a semiconductor device according to an embodiment.

Referring to FIG. 17A, an etching process using a mask pattern 207A including first holes 211 may be performed such that a conductive layer 205A penetrated by second holes 213. The conductive layer 205A may be formed above a common source region 201 covered with a lower insulating layer 203.

The common source region 201 may be defined by injecting an n-type dopant into a single crystal silicon substrate. In other examples, the common source region 201 may be a doped silicon layer stacked above the peripheral circuit structure PC shown in FIG. 1B. The doped silicon layer may include an n-type dopant. The lower insulating layer 203 may include a silicon oxide layer.

Forming the conductive layer 205A penetrated by the second holes 213 may include sequentially stacking a conductive layer and a mask layer which include the line regions LA and the etching regions C1 and C2 on the lower insulating layer 203, forming a photoresist pattern 209 on the mask layer, forming the first holes 211 by etching a portion of the mask layer by an etching process using the photoresist pattern 209 as an etch barrier, and etching and removing portions of the respective line regions LA of the conductive layer which are exposed through the first holes 211 to form the second holes 213.

The line regions LA and the etching regions C1 and C2 may be arranged the same as the line regions LA and the etching regions C1 and C2 shown in FIG. 12A. The second holes 213 may extend to pass through the lower insulating layer 203. The second holes 213 may expose the common source region 201. The conductive layer 205A may include various conductive materials. For example, the conductive layer 205A may include a polysilicon layer.

Figure 17B:
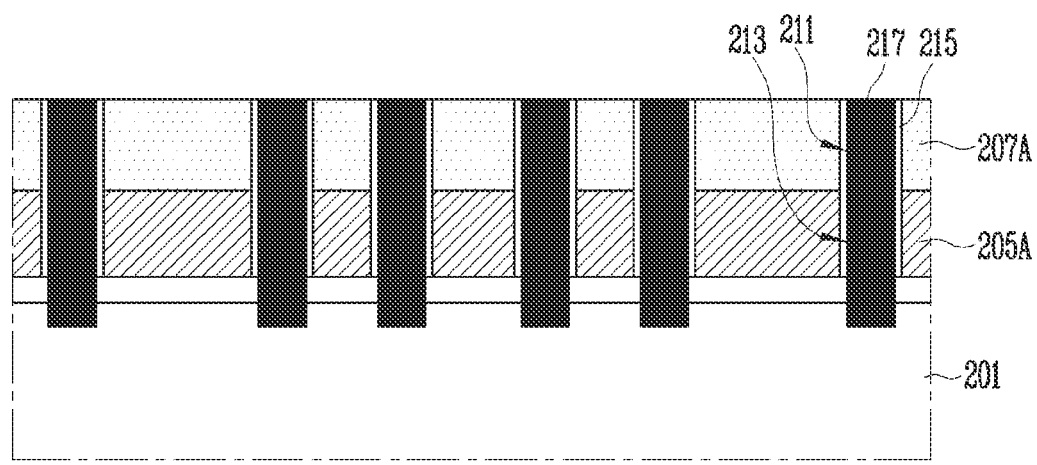

Referring to FIG. 17B, the photoresist pattern 209 shown in FIG. 17A may be removed after forming the second holes 213. Subsequently, gate insulating layers 215 may be formed on sidewalls of the second holes 213, respectively. The gate insulating layers 215 may extend to sidewalls of the first holes 211, respectively.

The gate insulating layers 215 may be formed using the processes described above with reference to FIG. 12C.

Thereafter, a lower channel structure 217 filling each of the second holes 213 may be formed. The lower channel structure 217 may extend into the corresponding first holes 211. The lower channel structure 217 may completely fill the first holes 211 and the second holes 213. The lower channel structure 217 may contact the common source region 201. The lower channel structure 217 may include a semiconductor material. For example, the lower channel structure 217 may include silicon, germanium, or a semiconductor compound. The lower channel structure 217 may include a dopant. For example, the lower channel structure 217 may include an n-type dopant.

The lower channel structure 217 may be formed by growing a semiconductor material by a selective epitaxial growth method. Alternatively, the lower channel structure 217 may be formed by depositing a semiconductor material. A dopant may be doped into the lower channel structure 217 by an in-situ method or an ion injection method.

The lower channel structures 217 shown in FIG. 17B may correspond to the first channel structures CH1 shown in FIG. 6B.

Figure 17C:
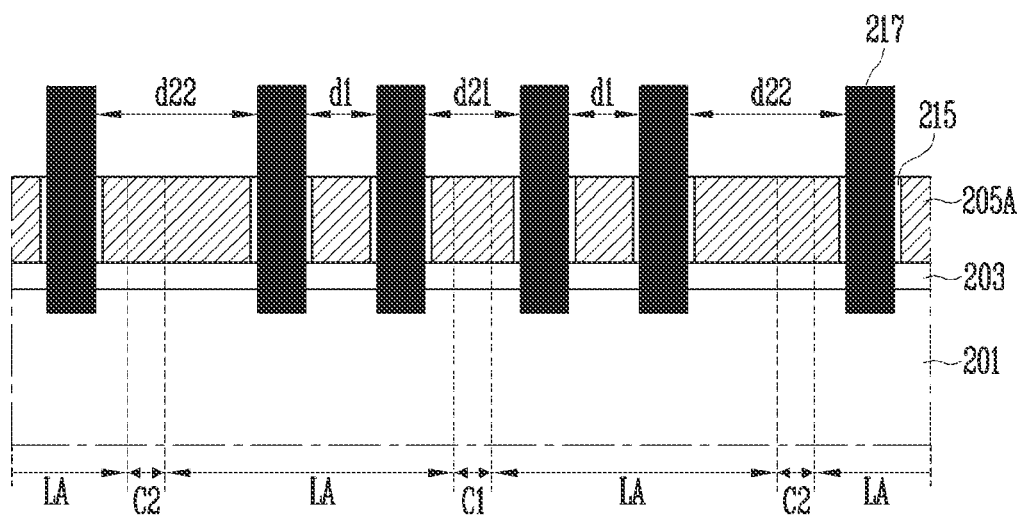

Referring to FIG. 17C, the mask pattern 207A shown in FIG. 17B may be selectively removed. Thereby, spaces between upper ends of the lower channel structures 217 which protrude farther than the conductive layer 205A may be opened. The lower channel structures 217 neighboring each other in each of the line regions LA may be spaced apart from each other at the first distance d1. The lower channel structures 217 neighboring each other with the first etching region C1 interposed therebetween may be spaced apart from each other at the second distance d21. The lower channel structures 217 neighboring each other with the etching region C2 interposed therebetween may be spaced apart from each other at the third distance d22. To miniaturize a semiconductor device, the second distance d21 may be smaller than the third distance d22. To divide the conductive layer 205A into line patterns by using a self-aligning method, each of the second distance d21 and the third distance d22 may be greater than the first distance d1.

Figure 17D:
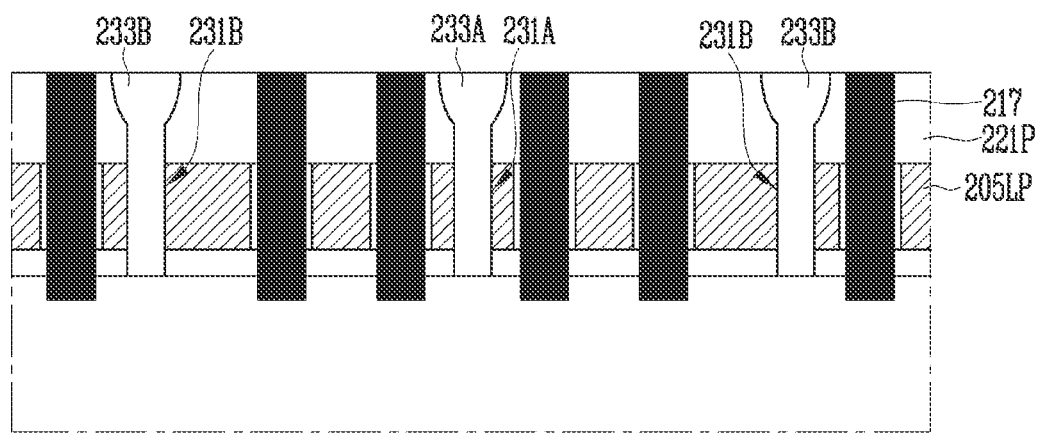

Referring to FIG. 17D, insulating patterns 221P filling the first distance d1 shown in FIG. 17C and having openings within the second distance d21 and the third distance d22 shown in FIG. 17C may be formed. The insulating patterns 221P may be planarized to expose upper surfaces of the lower channel structures 217. Thereafter, the first etching region C1 and the second etching region C2 of the conductive layer 205A shown in FIG. 17C may be removed by using the insulating patterns 221P to divide the conductive layer 205A into line patterns 205LP.

The insulating patterns 221P may be formed using the processes described with reference to FIGS. 13A, 13B, 14A, 14B, and 15A. Alternatively, the insulating patterns 221P may be formed using the processes described with reference to FIGS. 16A and 16B.

The line patterns 205LP may be spaced apart from each other by a first separation region 231A and a second separation region 231B. Each of the line patterns 205LP may correspond to the source select line SSL shown in FIG. 6B.

The first separation region 231A may be defined at a region from which the first etching region C1 shown in FIG. 17C is removed and the second separation region 231B may be defined at a region from which the second etching region C2 shown in FIG. 17C is removed. The first separation region 231A and the second separation region 231B may correspond to the first separation region CU1 and the second separation region CU2 which have the straight sidewalls shown in FIG. 5, respectively, or may correspond to the first separation region CU1 and the second separation region CU2 which have the wavy sidewalls shown in FIG. 9, respectively.

Subsequently, the first separation region 231A and the second separation region 231B may be filled with gap-fill insulating layers 233A and 233B by using the same processes described above with reference to FIG. 15B or 16B. The gap-fill insulating layers 233A and 233B may be divided into the first gap-fill insulating layer 233A filling the first separation region 231A and the second gap-fill insulating layer 233B filing the second separation region 231B.

Figure 17E:
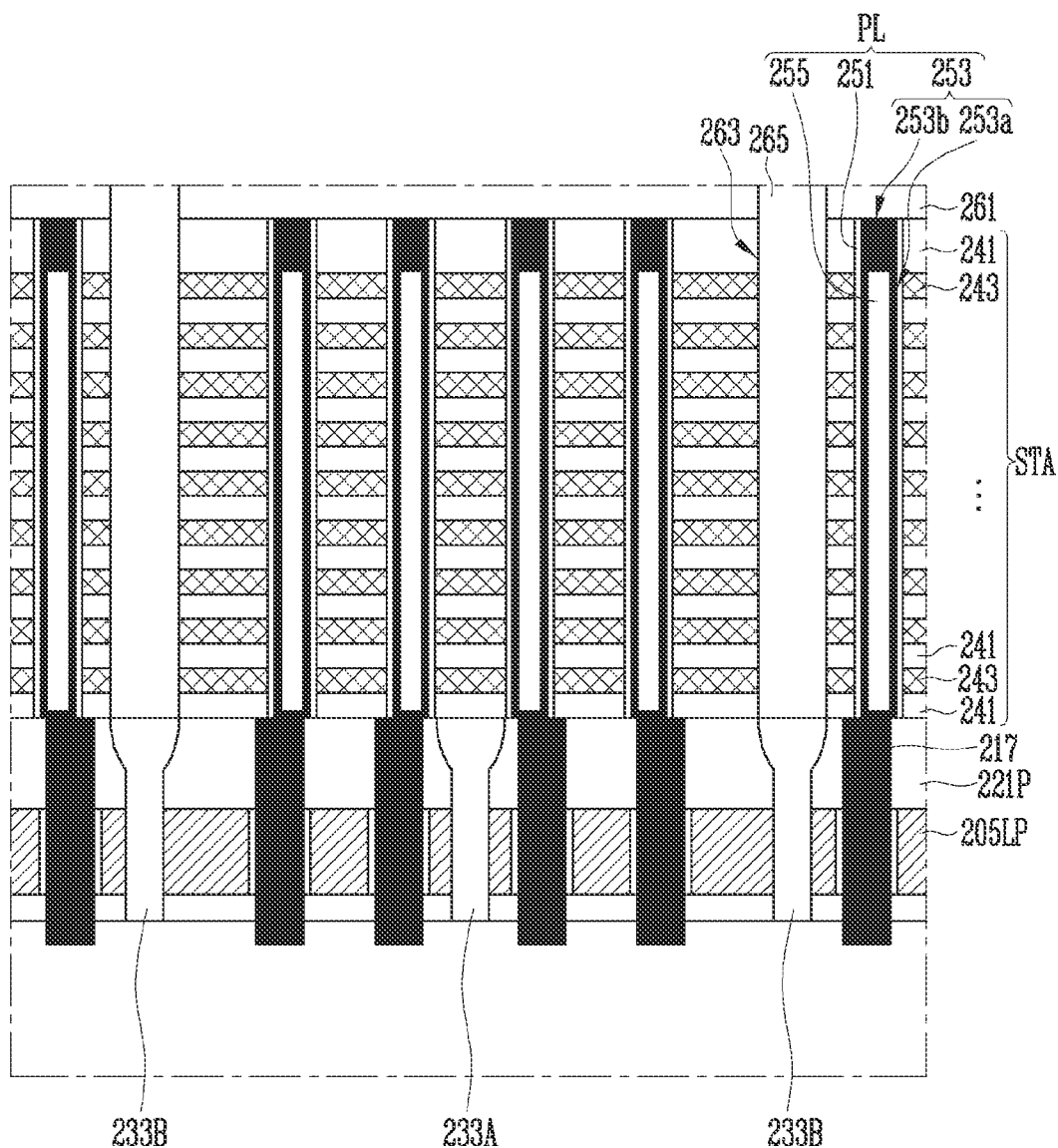

Referring to FIG. 17E, the stack structures STA may be formed on the insulating patterns 221P separated by the first gap-fill insulating layer 233A or the second gap-fill insulating layer 233B and penetrated by the lower channel structures 217. The stack structures STA may be formed using the process illustrated in FIG. 10.

Each of the stack structures STA may include interlayer insulating layers 241 and conductive patterns 243 alternately stacked with each other. The conductive patterns 243 may correspond to the word lines WL and the drain select line DSL which are shown in FIG. 6B. Each of the stack structures STA may be penetrated by the cell pillars PL formed using the process described above with reference to FIG. 10 and may be separated from each other by slits 263.

The cell pillars PL may include memory layers 251 and upper channel structures 253. Each of the memory layers 251 may have a tube-shaped structure of which an upper portion and a lower portion are open. The upper channel structures 253 may contact the lower channel structures 217. Each of the upper channel structures 253 may be coupled to the corresponding lower channel structure 217 through the open lower portion of the corresponding memory layer 251. The upper channel structures 253 may correspond to the second channel structure CH2 shown in FIG. 6B.

Each of the upper channel structures 253 may be divided into a first region 253a and a second region 253b and may include a semiconductor material as described above with reference to FIG. 11. Each of the upper channel structures 253 may further include a core insulating layer 255 filling a central region of the first region 253a.

The stack structures STA penetrated by the cell pillars PL may be covered by an upper insulating layer 261. The upper insulating layer 261 may be formed before the mask pattern for forming the slits 263 is formed in step P5 shown in FIG. 10. The upper insulating layer 261 may be penetrated by the slits 263.

Each of the slits 263 may be filled with a vertical structure 265. The vertical structure 265 may include an oxide layer. The slits 263 may overlap the second gap-fill insulating layers 233B, respectively.

Each of the stack structures STA may overlap the corresponding first gap-fill insulating layer 233A. Thereby, each of the stack structures STA may extend to overlap the line patterns 205LP neighboring each other with the first gap-fill insulating layer 233A interposed therebetween.

The upper channel structures 253 coupled to the lower channel structures 217 may be distributed to have a uniform density in each of the stack structures STA. The upper channel structures 253 may be arranged to have a smaller distance from each other than each of the second distance d21 and the third distance d22 shown in FIG. 17C in each of the stack structures STA.

The lower channel structures 217 may be disposed closer to the second gap-fill insulating layers 233B than the upper channel structures 253. A horizontal distance between the lower channel structures 217 neighboring the first gap-fill insulating layer 233A and the first gap-fill insulating layer 233A may be greater than a horizontal distance between the upper channel structures 253 adjacent to the first gap-fill insulating layer 233A and the first gap-fill insulating layer 233A.

Thereafter, a subsequent process for forming the bit contact plugs BCT shown in FIG. 6B may be performed.

The upper channel structure 161 and the upper core insulating layer 163 shown in FIG. 12C may be replaced by the first channel structure CH1 shown in FIG. 8A. A forming process of the lower channel structure described above with reference to FIG. 17B may be used to form an upper channel structure the same as the first channel structure CH1 shown in FIG. 8A.

The lower channel structure 217 shown in FIG. 17B may be replaced by the first channel structure CH1 and the lower core insulating layer LCO which are shown in FIG. 8B. The forming process of the upper channel structure and the upper core insulating layer described above with reference to FIG. 12C may be used to form a lower channel structure and a lower core insulating layer the sane as the first channel structure CH1 and the lower core insulating layer LCO which are shown in FIG. 8B.

According to the embodiments as described above, a layer to be etched may be divided into a plurality of patterns by using channel structures which pass through the layer to be etched and protrude farther than the layer to be etched and insulating patterns which have a thickness to fill a portion of distances between protruding portions of the channel structures and to provide openings for the rest of the distances. Thereby, according to an embodiment, a layer to be etched may be divided into a plurality of patterns even in a small area, and a space occupied by a separation region between each of neighboring patterns may be decreased. Therefore, according to an embodiment, integration density of a semiconductor device may be improved.

In addition, according to an embodiment, even when expensive photolithography equipment is not introduced for micro patterning, a layer to be etched may be divided into a plurality of patterns even within a small area. Thereby, manufacturing costs of a semiconductor device may be reduced according to an embodiment.

Figure 18:
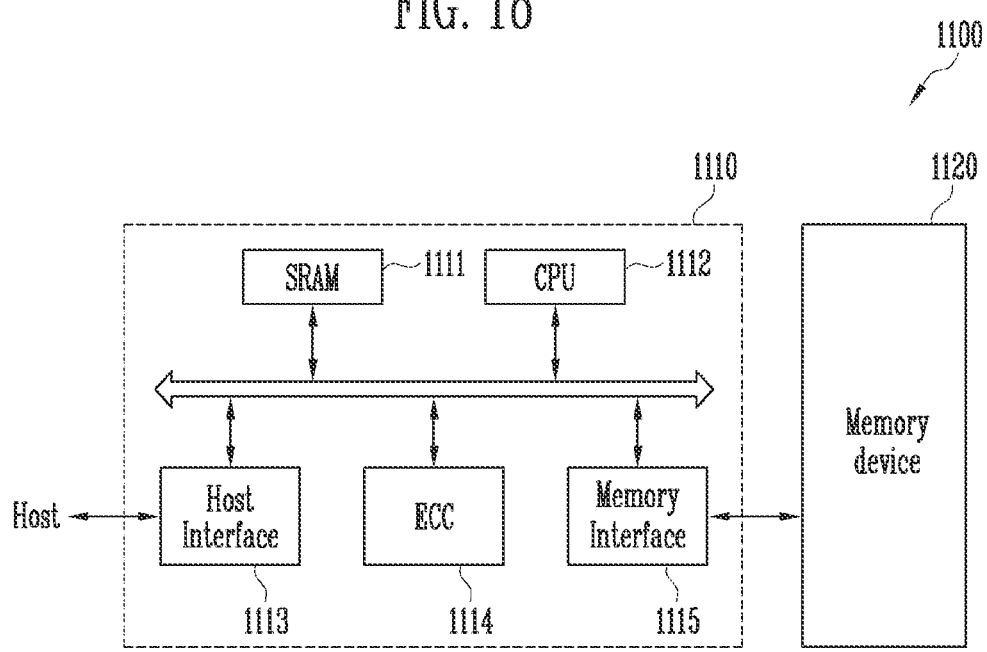
FIG. 18 is a block diagram illustrating a configuration of a memory system according to an embodiment.

FIG. 18 is a block diagram illustrating a configuration of a memory system 1100 according to an embodiment.

Referring to FIG. 18, the memory system 1100 according to an embodiment may include a memory device 1120 and a memory controller 1110.

The memory device 1120 may be a multichip package formed of a plurality of flash memory chips. The memory device 1120 may include at least one of the semiconductor devices according to the embodiments described above with reference to FIGS. 3A to 3D, 4, 5, 6A, 6B, 7A to 7C, 8A, 8B, and 9.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112, the CPU 1112 may perform overall control operations for data exchange of the memory controller 1110, and the host interface 1113 may include a data exchange protocol for a host connected with the memory system 1100. In addition, the ECC 1114 may detect and correct errors included in the data read from the memory device 1120, and the memory interface 1115 may perform interfacing with the memory device 1120. In addition, the memory controller 1110 may further include a Read Only Memory (ROM) for storing code data for interfacing with the host.

The above-described memory system 1100 may be a memory card or a Solid State Disk (SSD) equipped with the memory device 1120 and the memory controller 1110. For example, when the memory system 1100 is an SSD, the memory controller 1110 may communicate with an external device (e.g., a host) through one of the various interface protocols including a Universal Serial Bus (USB), a Multi-Media Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE) and the like.

Figure 19:
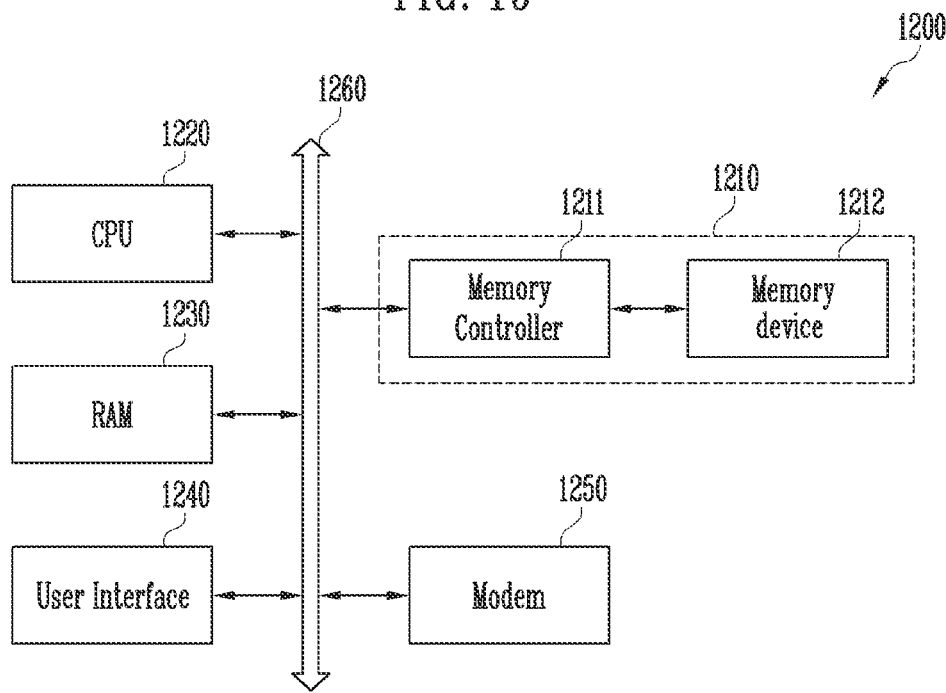
FIG. 19 is a block diagram illustrating a configuration of a computing system according to an embodiment.

FIG. 19 is a block diagram illustrating a configuration of a computing system 1200 according to an embodiment.

Referring to FIG. 19, the computing system 1200 according to an embodiment may include a CPU 1220, a Random Access Memory (RAM) 1230, a user interface 1240, a modem 1250, and a memory system 1210 which are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included. The memory system 1210 may include a memory controller 1211 and a memory device 1212. In some embodiments, the memory system 1210 may include the memory system 1100 according to the embodiments described above with reference to FIG. 18. The memory device 1212 may include at least one of the semiconductor devices according to the embodiments described above with reference to FIGS. 3A to 3D, 4, 5, 6A, 6B, 7A to 7C, 8A, 8B, and 9.

So far as not being differently defined, all terms used herein including technical or scientific terminologies have meanings that they are commonly understood by those skilled in the art to which the present disclosure pertains. So far as not being clearly defined in this application, terms should not be understood in an ideally or excessively formal way.

What is claimed is:

1. A method of manufacturing a semiconductor device, the method comprising:
    forming a conductive layer including line regions and etching regions alternately disposed with each other;
    forming first channel structures passing through the conductive layer in the line regions and protruding farther than the conductive layer;
    forming insulating patterns filling a first distance defined between the first channel structures in each of the line regions after forming the first channel structures, wherein each of the insulating patterns covers a top surface of the conductive layer; and
    removing the etching regions of the conductive layer which are exposed between the insulating patterns to divide the conductive layer into line patterns.

2. The method of claim 1, wherein the forming of the first channel structures protruding farther than the conductive layer comprises:
    forming a mask pattern including first holes above the conductive layer;
    forming second holes by etching the conductive layer exposed through the first holes;

forming the first channel structures filling the second holes, respectively, and extending to fill the first holes, respectively; and removing the mask pattern.

3. The method of claim 2, comprising before forming the first channel structures, forming gate insulating layers on sidewalls of the conductive layer which are exposed through the second holes.

4. The method of claim 1, wherein the first channel structures include edge channel structures neighboring each other with each of the etching regions interposed therebetween, and disposed at a second distance greater than the first distance.

5. The method of claim 4, wherein the forming of the insulating patterns comprises:

forming a spacer insulating layer above the conductive layer penetrated by the first channel structures, the spacer insulating layer completely filling the first distance and including openings within the second distance; and etching a portion of the spacer insulating layer such that the spacer insulating layer remains above sidewalls of the first channel structures, and the conductive layer is exposed through the second distance.

6. The method of claim 5, wherein the forming of the insulating patterns further comprises:

forming a protective pattern overlapping each of the line regions of the conductive layer above the spacer insulating layer before etching the portion of the spacer insulating layer; and removing the protective pattern after etching the portion of the spacer insulating layer.

7. The method of claim 1, further comprising before forming the conductive layer or after removing the etching regions of the conductive layer, forming stack structures each penetrated by second channel structures and separated from each other by slits.

8. The method of claim 7, wherein the second channel structures, in each of the stack structures, are arranged at a smaller distance than a second distance between edge channel structures neighboring each other with each of the etching regions interposed therebetween.

9. The method of claim 7, wherein the etching regions include first etching regions overlapping the stack structures and second etching regions overlapping the slits.

10. The method of claim 9, wherein the first channel structures are disposed closer to the second etching regions than the second channel structures.

11. The method of claim 9, wherein a horizontal distance between edge channel structures adjacent to the first etching regions, among the first channel structures and the first etching regions is greater than a horizontal distance between center channel structures adjacent to the first etching regions, among the second channel structures and the first etching regions.

12. The method of claim 7, wherein each of the stack structures includes interlayer insulating layers and conductive patterns alternately stacked with each other.

\* \* \* \* \*